(12) United States Patent
Motoyama

(10) Patent No.: US 11,817,843 B2
(45) Date of Patent: Nov. 14, 2023

(54) LC FILTER

(71) Applicant: Murata Manufacturing Co., Ltd., Nagaokakyo (JP)

(72) Inventor: Hiroto Motoyama, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 128 days.

(21) Appl. No.: 17/526,067

(22) Filed: Nov. 15, 2021

(65) Prior Publication Data

US 2022/0077836 A1    Mar. 10, 2022

Related U.S. Application Data

(63) Continuation of application No. PCT/JP2020/022115, filed on Jun. 4, 2020.

(30) Foreign Application Priority Data

Jul. 9, 2019  (JP) .................................. 2019-127478
Mar. 4, 2020  (JP) .................................. 2020-036605

(51) Int. Cl.
*H03H 7/01*   (2006.01)
*H03H 1/00*   (2006.01)

(52) U.S. Cl.
CPC ........ *H03H 7/1766* (2013.01); *H03H 7/0115* (2013.01); *H03H 2001/0085* (2013.01)

(58) Field of Classification Search
CPC ......... H03H 2001/0085; H03H 7/0115; H03H 7/1766
USPC ................................................. 333/175, 185
See application file for complete search history.

(56) References Cited

U.S. PATENT DOCUMENTS

2017/0093358 A1*  3/2017  Imamura ................... H03H 7/09
2019/0181826 A1   6/2019  Imamura
2019/0305745 A1   10/2019  Taniguchi

FOREIGN PATENT DOCUMENTS

| JP | 2014-027690 A | 2/2014 |
| JP | 2019-103108 A | 6/2019 |
| WO | 2018/100923 A1 | 6/2018 |
| WO | 2019/097774 A1 | 5/2019 |

OTHER PUBLICATIONS

Official Communication issued in International Patent Application No. PCT/JP2020/022115, dated Aug. 25, 2020.

* cited by examiner

*Primary Examiner* — Rakesh B Patel
(74) *Attorney, Agent, or Firm* — KEATING & BENNETT, LLP

(57) ABSTRACT

An LC filter includes a first electrode connected to a first via conductor between two ends of the first via conductor, a second electrode connected to a second via conductor between two ends of the second via conductor, a third electrode connected to a third via conductor between two ends of the third via conductor, and a fourth electrode connected to a fourth via conductor between two ends of the fourth via conductor. In a plan view viewed from the laminating direction, the second via conductor and the fourth via conductor are disposed on two sides of a virtual line connecting the first via conductor and the third via conductor, respectively. The second electrode faces the first electrode and the third electrode.

18 Claims, 23 Drawing Sheets

FIG.6
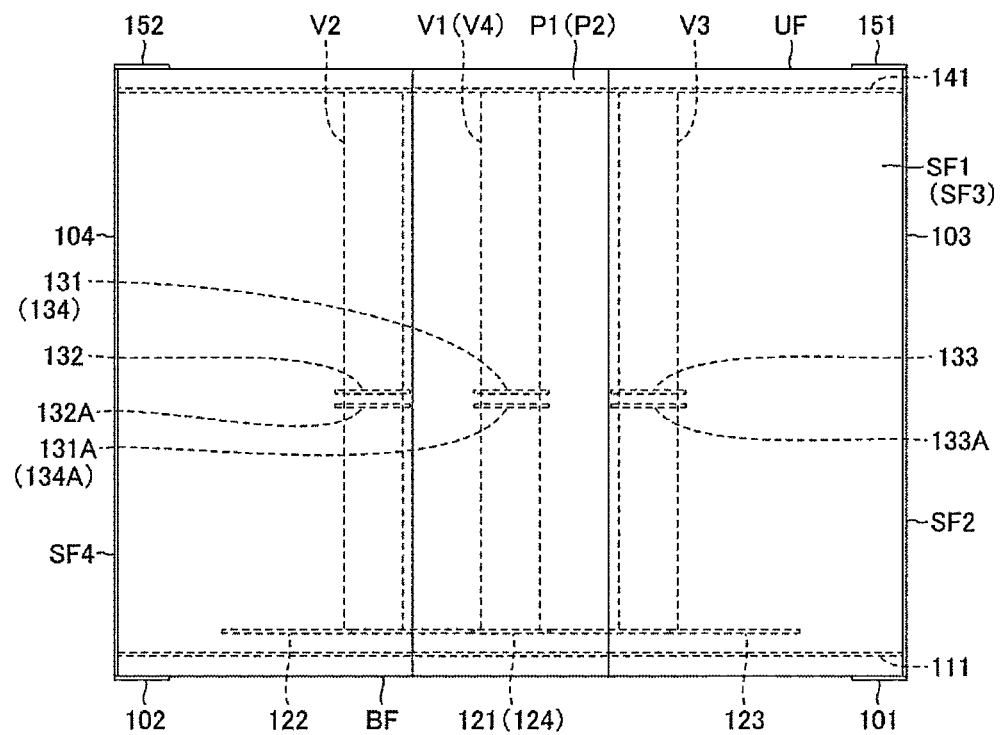
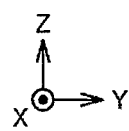

LC FILTER

CROSS REFERENCE TO RELATED APPLICATIONS

This application claims the benefit of priority to Japanese Patent Application No. 2019-127478 filed on Jul. 9, 2019 and Japanese Patent Application No. 2020-036605 filed on Mar. 4, 2020, and is a Continuation Application of PCT Application No. PCT/JP2020/022115 filed on Jun. 4, 2020. The entire contents of each application are hereby incorporated herein by reference.

BACKGROUND OF THE INVENTION

1. Field of the Invention

The present invention relates to an LC filter including a plurality of LC resonators.

2. Description of the Related Art

Conventionally, an LC filter including a plurality of LC resonators is known. For example, International Publication No. 2018/100923 discloses a band pass filter in which four LC resonators are disposed in a staggered manner so that each of the four LC resonators is adjacent to at least two other LC resonators. In a case where the four LC resonators are disposed in a staggered manner, magnetic coupling between LC resonators is stronger than in a case where the four LC resonators are disposed in a straight manner, and therefore a pass band of the band pass filter can be widened.

Characteristics of an LC filter need to be adjusted in accordance with a communication system in which the LC filter is used. In a case where characteristics of an LC filter disclosed in International Publication No. 2018/100923 are adjusted, a structure of an LC resonator needs to be changed, for example, by changing a position of an inductor included in the LC resonator and a capacitance value of a capacitor included in the LC resonator.

In a small-sized LC filter, a design space in which an LC resonator can be disposed is limited. A change of a structure of the LC resonator in the limited design space can influence the entire design space and therefore can change characteristics of the LC filter to characteristics that are deviated from desired characteristics. Therefore, the LC filter disclosed in International Publication No. 2018/100923 still has a room for improvement of accuracy of adjustment of characteristics of the LC filter.

SUMMARY OF THE INVENTION

Preferred embodiments of the present invention provide LC filters each having improved accuracy of adjustment of characteristics.

In an LC filter according to a preferred embodiment of the present invention, a plurality of dielectric layers are laminated in a laminating direction. The LC filter includes a first LC resonator, a second LC resonator, a third LC resonator, and a fourth LC resonator. The first LC resonator includes a first via conductor and at least one first electrode. The first via conductor extends in the laminating direction. The first electrode is connected to the first via conductor between two ends of the first via conductor. The second LC resonator includes a second via conductor and at least one second electrode. The second via conductor extends in the laminating direction. The second electrode is connected to the second via conductor between two ends of the second via conductor. The third LC resonator includes a third via conductor and at least one third electrode. The third via conductor extends in the laminating direction. The third electrode is connected to the third via conductor between two ends of the third via conductor. The fourth LC resonator includes a fourth via conductor. The fourth via conductor extends in the laminating direction. In plan view viewed from the laminating direction, the second via conductor and the fourth via conductor are disposed on both sides of a virtual line connecting the first via conductor and the third via conductor, respectively. The second electrode faces the first electrode and the third electrode.

In each of LC filters according to preferred embodiments of the present invention, the second electrode faces the first electrode and the third electrode, and therefore accuracy of adjustment of characteristics of the LC filters can be improved.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 6 is a plan view of a side surface of the band pass filter of FIG. 5 viewed from the X-axis direction.

DETAILED DESCRIPTION OF THE PREFERRED EMBODIMENTS

Figure 1:
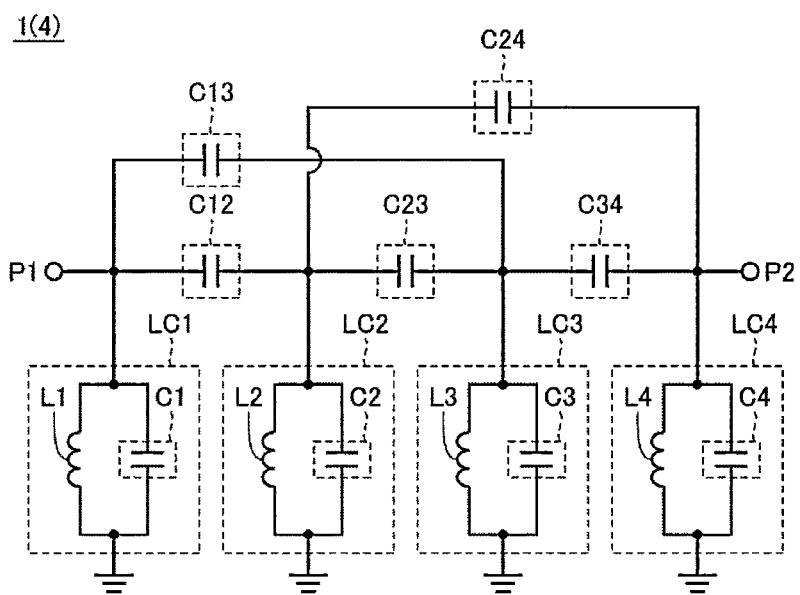
FIG. 1 is an equivalent circuit diagram of a band pass filter which is an example of an LC filter according to Preferred Embodiment 1 of the present invention.

Preferred embodiments of the present invention are described in detail below with reference to the drawings. Note that the same or corresponding portions in the drawings are denoted by the same reference signs, and description thereof is not repeated in principle.

Preferred Embodiment 1

FIG. 1 is an equivalent circuit diagram of a band pass filter 1, which is an example of an LC filter according to Preferred Embodiment 1 of the present invention. As illustrated in FIG. 1, the band pass filter 1 includes input/output terminals P1 and P2, LC parallel resonators LC1 to LC4, a capacitor C12, a capacitor C13, a capacitor C23, a capacitor C24, and a capacitor C34. Hereinafter, a wavelength corresponding to a used frequency (e.g., a center frequency of a pass band) of a band pass filter is λ. The LC filter according to the preferred embodiment may include an LC series resonator.

The LC parallel resonator LC1 is connected to the input/output terminal P1. The LC parallel resonator LC4 is connected to the input/output terminal P2. Note that the LC parallel resonator LC1 may be connected to the input/output terminal P1 indirectly with an element, such as an inductor or a capacitor, for example, interposed therebetween. Similarly, the LC parallel resonator LC4 may be connected to the input/output terminal P2 indirectly with an element, such as an inductor or a capacitor, for example, interposed therebetween.

The LC parallel resonators LC2 and LC3 are disposed between the LC parallel resonators LC1 and LC4. The LC parallel resonators LC1 to LC4 are sequentially coupled in accordance with the strength of magnetic coupling and capacitive coupling, which will be described later, to define a four-stage LC filter.

The capacitor C12 is connected between the LC parallel resonators LC1 and LC2. The capacitor C12 represents capacitive coupling between the LC parallel resonators LC1 and LC2.

The capacitor C13 is connected between the LC parallel resonators LC1 and LC3. The capacitor C13 represents capacitive coupling between the LC parallel resonators LC1 and LC3.

The capacitor C23 is connected between the LC parallel resonators LC2 and LC3. The capacitor C23 represents capacitive coupling between the LC parallel resonators LC2 and LC3.

The capacitor C24 is connected between the LC parallel resonators LC2 and LC4. The capacitor C24 represents capacitive coupling between the LC parallel resonators LC2 and LC4.

The capacitor C34 is connected between the LC parallel resonators LC3 and LC4. The capacitor C34 represents capacitive coupling between the LC parallel resonators LC3 and LC4.

The LC parallel resonator LC1 (first LC resonator) includes an inductor L1 and a capacitor C1. The inductor L1 and the capacitor C1 are connected in parallel between a ground point and a connection point between the input/output terminal P1 and the capacitor C12.

The LC parallel resonator LC2 (second LC resonator) includes an inductor L2 and a capacitor C2. The inductor L2 and the capacitor C2 are connected in parallel between a ground point and a connection point between the capacitors C12 and C23.

The LC parallel resonator LC3 (fourth LC resonator) includes an inductor L3 and a capacitor C3. The inductor L3 and the capacitor C3 are connected in parallel between a ground point and a connection point between the capacitors C23 and C34.

The LC parallel resonator LC4 (third LC resonator) includes an inductor L4 and a capacitor C4. The inductor L4 and the capacitor C4 are connected in parallel between a ground point and a connection point between the capacitor C34 and the input/output terminal P2.

Figure 2:
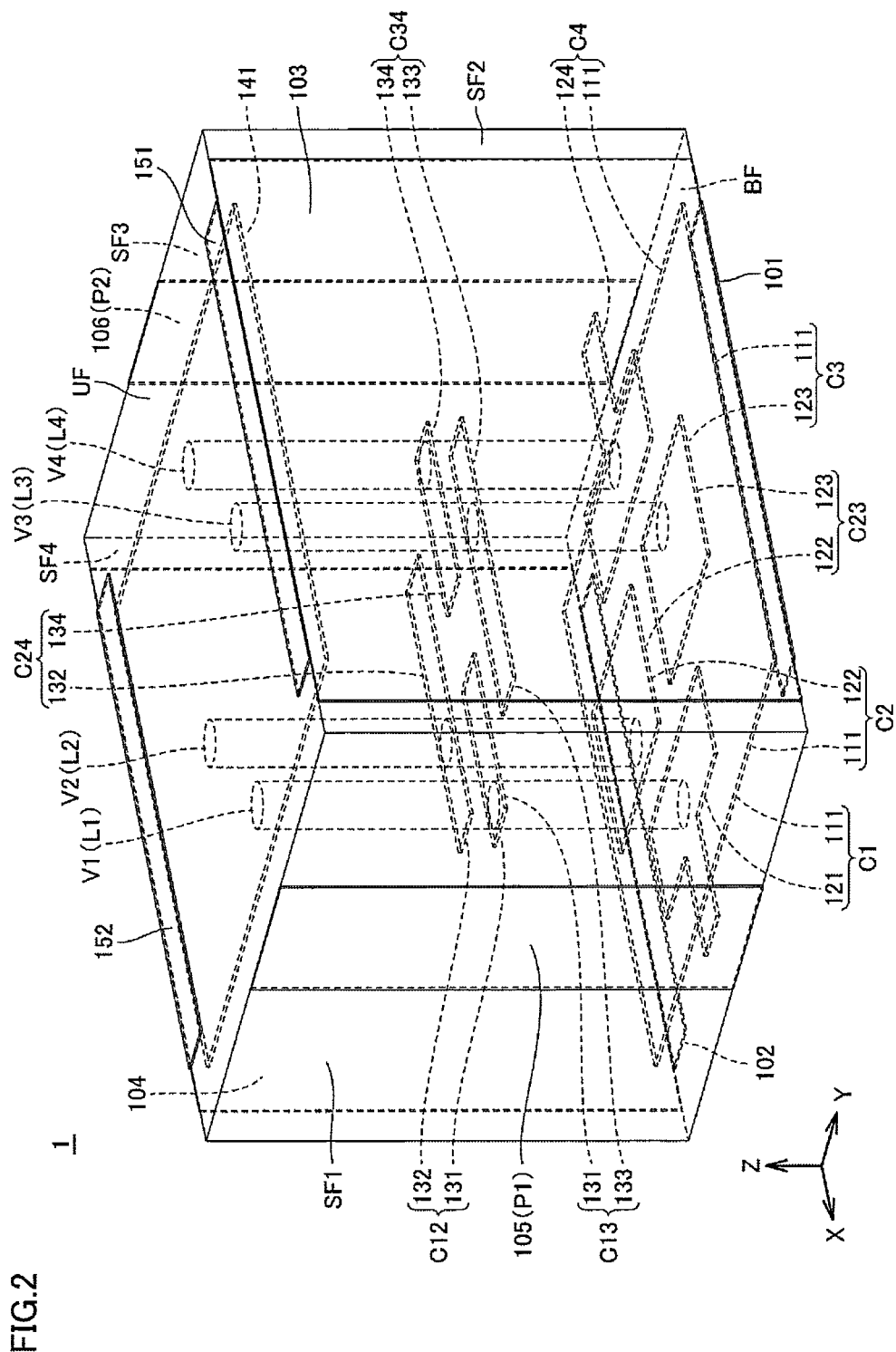
FIG. 2 is an outer appearance perspective view of the band pass filter of FIG. 1.

FIG. 2 is an outer appearance perspective view of the band pass filter 1 of FIG. 1. In FIG. 2, the X axis, the Y axis, and the Z axis are orthogonal or substantially orthogonal to one another. The same applies to FIGS. 3 to 8, 10, 11, 13, 15, and 16, which will be described later.

The band pass filter 1 is a multilayer body including a plurality of dielectric layers that are laminated in a Z-axis direction (laminating direction) (see FIG. 2). The band pass filter 1 has, for example, a rectangular or substantially rectangular parallelepiped shape. Surfaces of the band pass filter 1 that extend along a direction perpendicular or substantially perpendicular to the Z-axis direction are referred to as a bottom surface BF and an upper surface UF. Among surfaces that extend along a direction parallel or substantially parallel with the laminating direction, surfaces that extend along a YZ plane are referred to as side surfaces SF1 and SF3. Among the surfaces that extend along the laminating direction, surfaces that extend along a ZX plane are referred to as side surfaces SF2 and SF4.

A side surface electrode 105 is disposed on the side surface SF1. The side surface electrode 105 defines the input/output terminal P1. A side surface electrode 106 is disposed on the side surface SF3. The side surface electrode 106 defines the input/output terminal P2.

Ground terminals 101 and 102 are disposed on the bottom surface BF. Ground terminals 151 and 152 are disposed on the upper surface UF. A side surface electrode 103 is disposed on the side surface SF2. The side surface electrode 103 connects the ground terminals 101 and 151. A side surface electrode 104 is disposed on the side surface SF4. The side surface electrode 104 connects the ground terminals 102 and 152. The ground terminals 101, 102, 151, and 152 correspond to the ground points in FIG. 1.

A ground electrode 111 (first ground electrode) and a ground electrode 141 (second ground electrode) are disposed inside the band pass filter 1. The ground electrode 111 faces the bottom surface BF. The ground electrode 141 faces the upper surface UF. Capacitor electrodes 121 to 124, via conductors V1 to V4, and plane electrodes 131 to 134 are disposed between the ground electrodes 111 and 141.

The capacitor electrode 121 (first capacitor electrode) is connected to the side surface electrode 105. The capacitor electrode 121 faces the ground electrode 111. The capacitor electrode 121 and the ground electrode 111 define the capacitor C1. The capacitor electrode 121 and the ground electrode 141 are connected by the via conductor V1 (first via conductor) extending in the Z-axis direction.

The via conductor V1 defines the inductor L1. One end of the via conductor V1 is connected to the capacitor electrode 121. The one end of the via conductor V1 is an open end that is galvanically isolated from the ground electrode 111 by the capacitor electrode 121. The LC parallel resonator LC1 is, for example, a $\lambda/4$ resonator. A length of the via conductor V1 is equal or substantially equal to $\lambda/4$.

The capacitor electrode 122 (second capacitor electrode) faces the ground electrode 111. The capacitor electrode 122 and the ground electrode 111 define the capacitor C2. The capacitor electrode 122 and the ground electrode 141 are connected by the via conductor V2 (second via conductor) extending in the Z-axis direction.

The via conductor V2 defines the inductor L2. One end of the via conductor V2 is connected to the capacitor electrode 122. The one end of the via conductor V2 is an open end that is galvanically isolated from the ground electrode 111 by the capacitor electrode 122. The LC parallel resonator LC2 is, for example, a $\lambda/4$ resonator. A length of the via conductor V2 is equal or substantially equal to $\lambda/4$.

The capacitor electrode 123 (fourth capacitor electrode) faces the ground electrode 111. The capacitor electrode 123 and the ground electrode 111 define the capacitor C3. The capacitor electrode 123 and the ground electrode 141 are connected by the via conductor V3 (fourth via conductor) extending in the Z-axis direction. The capacitor electrode 123 faces the capacitor electrode 122 in a Y-axis direction. The capacitor electrodes 122 and 123 define the capacitor C23.

The via conductor V3 defines the inductor L3. One end of the via conductor V3 is connected to the capacitor electrode 123. The one end of the via conductor V3 is an open end that is galvanically isolated from the ground electrode 111 by the capacitor electrode 123. The LC parallel resonator LC3 is, for example, a $\lambda/4$ resonator. A length of the via conductor V3 is equal or substantially equal to $\lambda/4$.

The capacitor electrode 124 (third capacitor electrode) is connected to the side surface electrode 106. The capacitor electrode 124 faces the ground electrode 111. The capacitor electrode 124 and the ground electrode 111 define the capacitor C4. The capacitor electrode 124 and the ground electrode 141 are connected by the via conductor V4 (third via conductor) extending in the Z-axis direction.

The via conductor V4 defines the inductor L4. One end of the via conductor V4 is connected to the capacitor electrode 124. The one end of the via conductor V4 is an open end that is galvanically isolated from the ground electrode 111 by the capacitor electrode 124. The LC parallel resonator LC4 is, for example, a $\lambda/4$ resonator. A length of the via conductor V4 is equal or substantially equal to $\lambda/4$.

The plane electrode 131 (first electrode) is connected to the via conductor V1 between both ends of the via conductor V1. The plane electrode 132 (second electrode) is connected to the via conductor V2 between both ends of the via conductor V2. The plane electrode 133 (fourth electrode) is connected to the via conductor V3 between both ends of the via conductor V3. The plane electrode 134 (third electrode) is connected to the via conductor V4 between both ends of the via conductor V4.

At least a portion of one side of the plane electrode 132 faces at least a portion of one side of each of the plane electrodes 131 and 134 in the Y-axis direction. The plane electrodes 131 and 132 define the capacitor C12. The plane electrodes 132 and 134 define the capacitor C24.

At least a portion of one side of the plane electrode 133 faces at least a portion of one side of each of the plane electrodes 131 and 134 in the Y-axis direction. The plane electrodes 131 and 133 define the capacitor C13. The plane electrodes 133 and 134 define the capacitor C34.

Figure 3:
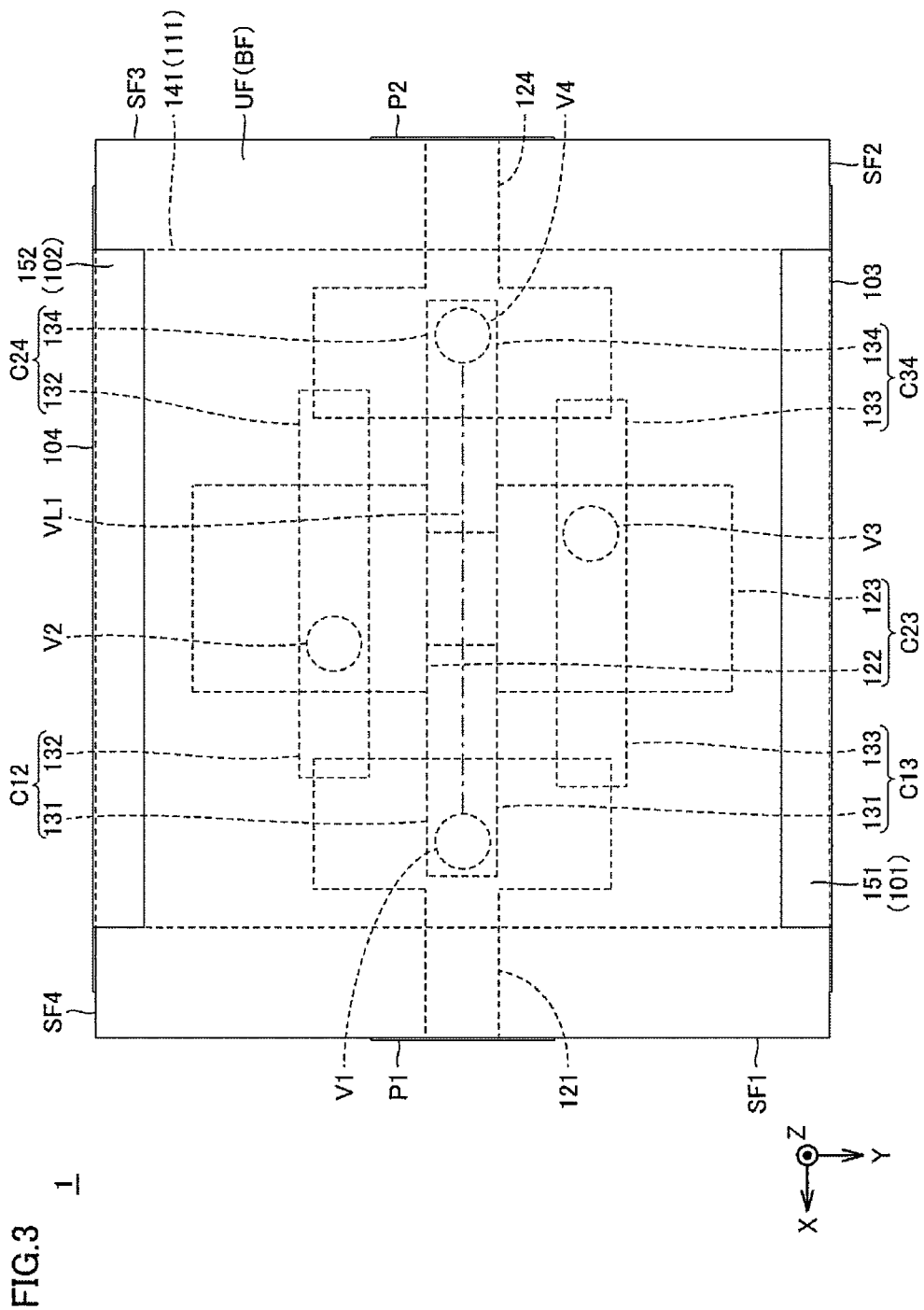
FIG. 3 is a plan view of an upper surface of the band pass filter of FIG. 2 viewed from the Z-axis direction.

FIG. 3 is a plan view of the upper surface UF of the band pass filter 1 of FIG. 2 viewed from the Z-axis direction. As illustrated in FIG. 3, the via conductors V2 and V3 are disposed on both sides of a virtual line VL1 connecting the via conductors V1 and V4, respectively. That is, the via conductors V1 and V4 are located on the virtual line VL1, and the via conductors V2 and V3 are not located on the virtual line VL1. The via conductor V2 is disposed on one side of the virtual line VL1, and the via conductor V3 is disposed on the other side of the virtual line VL1. When the band pass filter 1 is viewed in plan view from the Y-axis direction, the via conductors V2 and V3 are sandwiched between the via conductors V1 and V4.

In general, each LC resonator is coupled with another LC resonator by magnetic coupling and capacitive coupling. The strength of these types of coupling is dependent upon shapes and positional relationships of the LC resonators. The LC resonators are sequentially coupled in accordance with the strength of overall coupling combining magnetic coupling and capacitive coupling to define an LC filter.

For example, it is assumed in Preferred Embodiment 1 that magnetic coupling is dominant over capacitive coupling. A distance between the via conductors V1 and V2 is shorter than a distance between the via conductors V1 and V3. Accordingly, magnetic coupling between the LC parallel resonators LC1 and LC2 is stronger than magnetic coupling between the LC parallel resonators LC1 and LC3.

A distance between the via conductors V4 and V3 is shorter than a distance between the via conductors V4 and V2. Accordingly, magnetic coupling between the LC parallel resonators LC4 and LC3 is stronger than magnetic coupling between the LC parallel resonators LC4 and LC2. As a result, the LC parallel resonator LC1, the LC parallel resonator LC2, the LC parallel resonator LC3, and the LC parallel resonator LC4 are coupled in this order from the input/output terminal P1 side to define a four-stage LC filter.

The via conductors V2 and V3 are disposed on both sides of the virtual line VL1, respectively. A distance between the via conductors V1 and V2 is shorter than a distance between the via conductors V1 and V3. A distance between the via conductors V4 and V3 is shorter than a distance between the via conductors V4 and V2. That is, the via conductors V1 to V4 are disposed in a staggered manner. As a result, the LC parallel resonators LC1 to LC4 of FIG. 1 are also disposed in a staggered manner. In a case where the LC parallel resonators LC1 to LC4 are disposed in a staggered manner, magnetic coupling between LC parallel resonators is stronger than in a case where the LC parallel resonators LC1 to LC4 are disposed in a straight manner. As a result, signal transmission between inductors is improved, and thus the pass band of the band pass filter 1 can be widened.

In the band pass filter 1, a capacitance of the capacitor C12, a capacitance of the capacitor C13, a capacitance of the capacitor C24, and a capacitance of the capacitor C34 can be individually adjusted by changing shapes and positions of the plane electrodes 131 to 134. As a result, characteristics of the band pass filter 1 can be brought close to desired characteristics with high accuracy.

Figure 4:
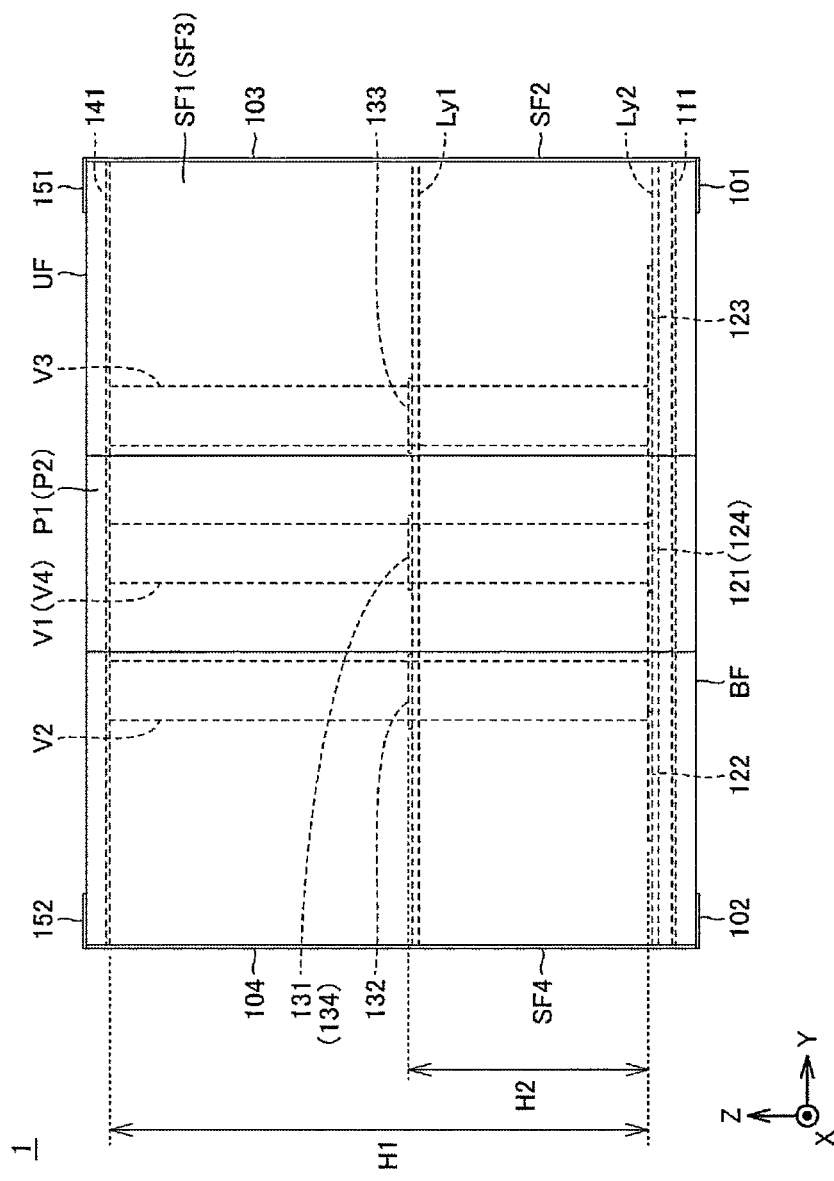
FIG. 4 is a plan view of a side surface of the band pass filter of FIG. 2 viewed from the X-axis direction.

FIG. 4 is a plan view of the side surface SF1 of the band pass filter 1 of FIG. 2 viewed from the X-axis direction. As illustrated in FIG. 4, the plane electrodes 131 to 134 are disposed in a dielectric layer Ly1 (first dielectric layer). By providing the plane electrodes 131 to 134 in the same dielectric layer, the height of the band pass filter 1 can be reduced.

In a case where the band pass filter 1 is produced by using ceramic multilevel substrate technology, a plurality of ceramic sheets in which a plurality of identical or substantially identical wire conductor patterns and through conductors are provided in a plane direction are laminated and burned to form a multilayer aggregate, and the multilayer aggregate is divided in the plane direction to produce individual band pass filters 1. In a case where characteristics of the band pass filter 1 are adjusted in accordance with a communication system, a trial multilayer aggregate in which shapes and positions of wire conductor patterns corresponding to the plane electrodes 131 to 134 are changed in the plane direction is provided, and this trial multilayer aggregate is divided to produce a plurality of trial band pass filters 1 having different characteristics. A band pass filter 1 that matches required characteristics is extracted from among the trial band pass filters 1, and a plane electrode pattern the same or substantially the same as this band pass filter 1 is used as a pattern for mass production. In this way, characteristics of the band pass filter 1 can be efficiently adjusted.

Note that the plane electrodes 131 to 134 need not be provided in the same dielectric layer. For example, the plane electrode 132 may be provided in a dielectric layer different from a dielectric layer in which the plane electrodes 131 and 134 are provided. In this case, a portion of one side of the plane electrode 132 is disposed so as to face at least a portion of one side of each of the plane electrodes 131 and 134 in the Z-axis direction. The same applies to the plane electrode 133.

The capacitor electrodes 121 to 124 are disposed in a dielectric layer Ly2 (second dielectric layer). By providing the capacitor electrodes 121 to 124 in the same dielectric layer, the height of the band pass filter 1 can be reduced.

A distance H1 is equal or substantially equal to a length of each of the via conductors V1 to V4. A distance H2 is a distance from the capacitor electrodes 121 to 124 to the plane electrodes 131 to 134. A ratio of the distance H2 to the distance H1 is equal to or larger than about 0.05 and equal to or less than about 0.95, for example. By connecting the plane electrode 131 not to a portion close to an end of the via conductor V1 but to a central portion of the via conductor V1, it is possible to reduce or prevent an influence of a change in shape and position of the plane electrode 131 on other circuit elements. The same applies to the plane electrodes 132 to 134.

Modification 1 of Preferred Embodiment 1

In Preferred Embodiment 1, a case where each LC resonator includes a single plane electrode for adjusting capacitive coupling between two LC resonators has been described. The number of plane electrodes included in each LC resonator may be more than one. In a case where each LC resonator includes plural plane electrodes, a width of characteristics that can be adjusted can be widened.

Figure 5:
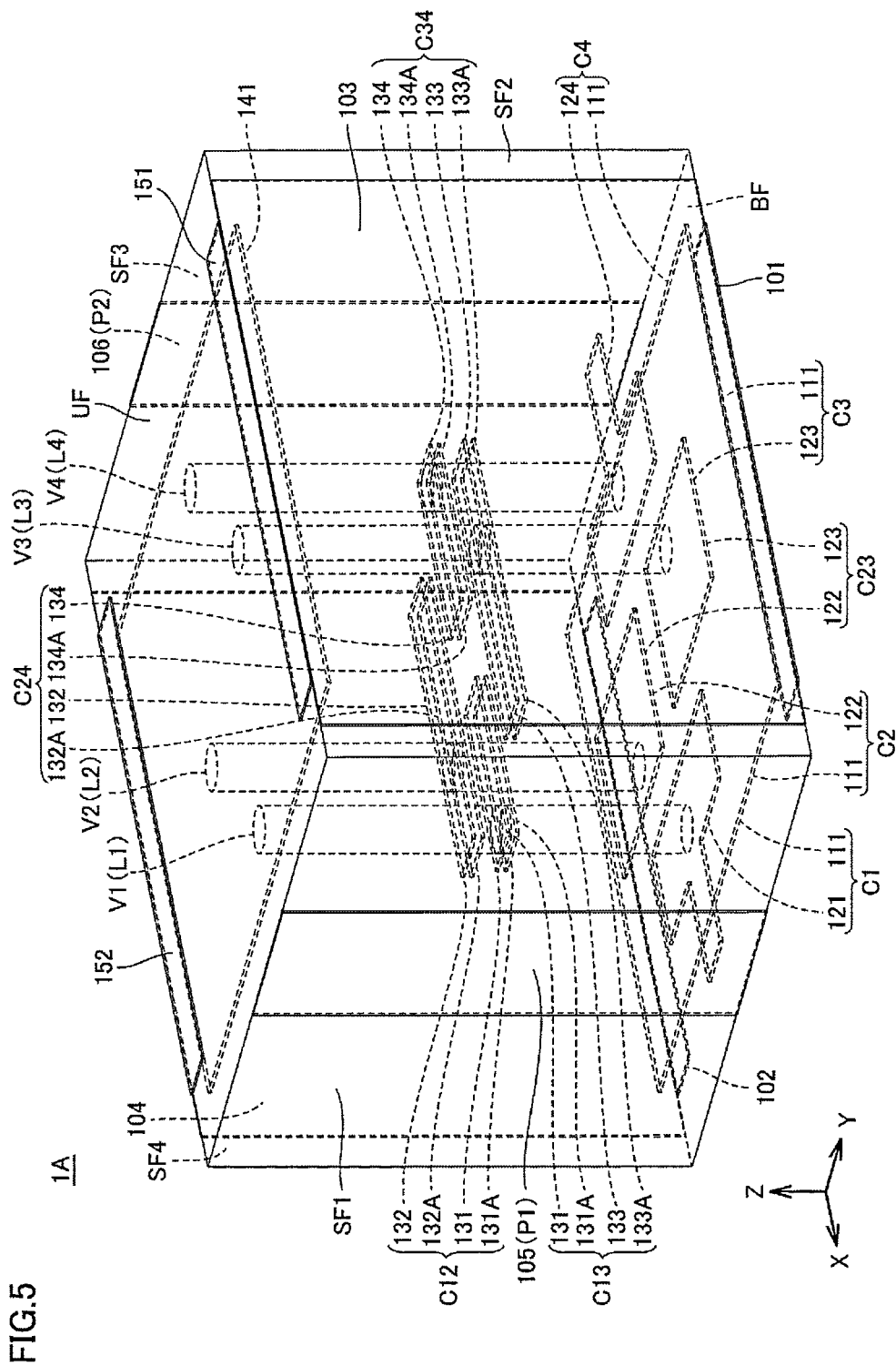
FIG. 5 is an outer appearance perspective view of a band pass filter which is an example of an LC filter according to Modification 1 of Preferred Embodiment 1 of the present invention.

FIG. 5 is an outer appearance perspective view of a band pass filter 1A, which is an example of an LC filter according to Modification 1 of Preferred Embodiment 1. FIG. 6 is a plan view of the side surface SF1 of the band pass filter 1A of FIG. 5 viewed from the X-axis direction. A configuration of the band pass filter 1A is the same as or similar to the configuration of the band pass filter 1 of FIG. 2, except that plane electrodes 131A to 134A are included. Repeated description of the same or similar points is omitted.

As illustrated in FIGS. 5 and 6, the plane electrode 131A (first electrode) is connected to the via conductor V1 between both ends of the via conductor V1. The plane electrode 131A is disposed along the plane electrode 131 between the plane electrode 131 and the capacitor electrode 121.

The plane electrode 132A (second electrode) is connected to the via conductor V2 between both ends of the via conductor V2. The plane electrode 132A is disposed along the plane electrode 132 between the plane electrode 132 and the capacitor electrode 122.

The plane electrode 133A (fourth electrode) is connected to the via conductor V3 between both ends of the via conductor V3. The plane electrode 133A is disposed along the plane electrode 133 between the plane electrode 133 and the capacitor electrode 123.

The plane electrode 134A (third electrode) is connected to the via conductor V4 between both ends of the via conductor V4. The plane electrode 134A is disposed along the plane electrode 134 between the plane electrode 134 and the capacitor electrode 124.

The plane electrode 132A faces the plane electrode 131A and the plane electrode 134A in the Y-axis direction. The plane electrodes 131, 131A, 132, and 132A define the capacitor C12. The plane electrodes 132, 132A, 134, and 134A define the capacitor C24.

The plane electrode 133A faces the plane electrode 131A and the plane electrode 134A in the Y-axis direction. The plane electrodes 131, 131A, 133, and 133A define the capacitor C13. The plane electrodes 133, 133A, 134, and 134A define the capacitor C34.

Modification 2 of Preferred Embodiment 1

In Preferred Embodiment 1, a configuration in which an electrode that defines an input/output terminal is disposed on a side surface (outer peripheral surface) of an LC filter including a multilayer body has been described. An input/output terminal may be provided on a surface other than the outer peripheral surface of the multilayer body. In Modification 2 of the Preferred Embodiment 1, a configuration in which an input/output terminal of a band pass filter is provided as a Land Grid Array (LGA) terminal regularly disposed on a bottom surface of a multilayer body is described.

Figure 7:
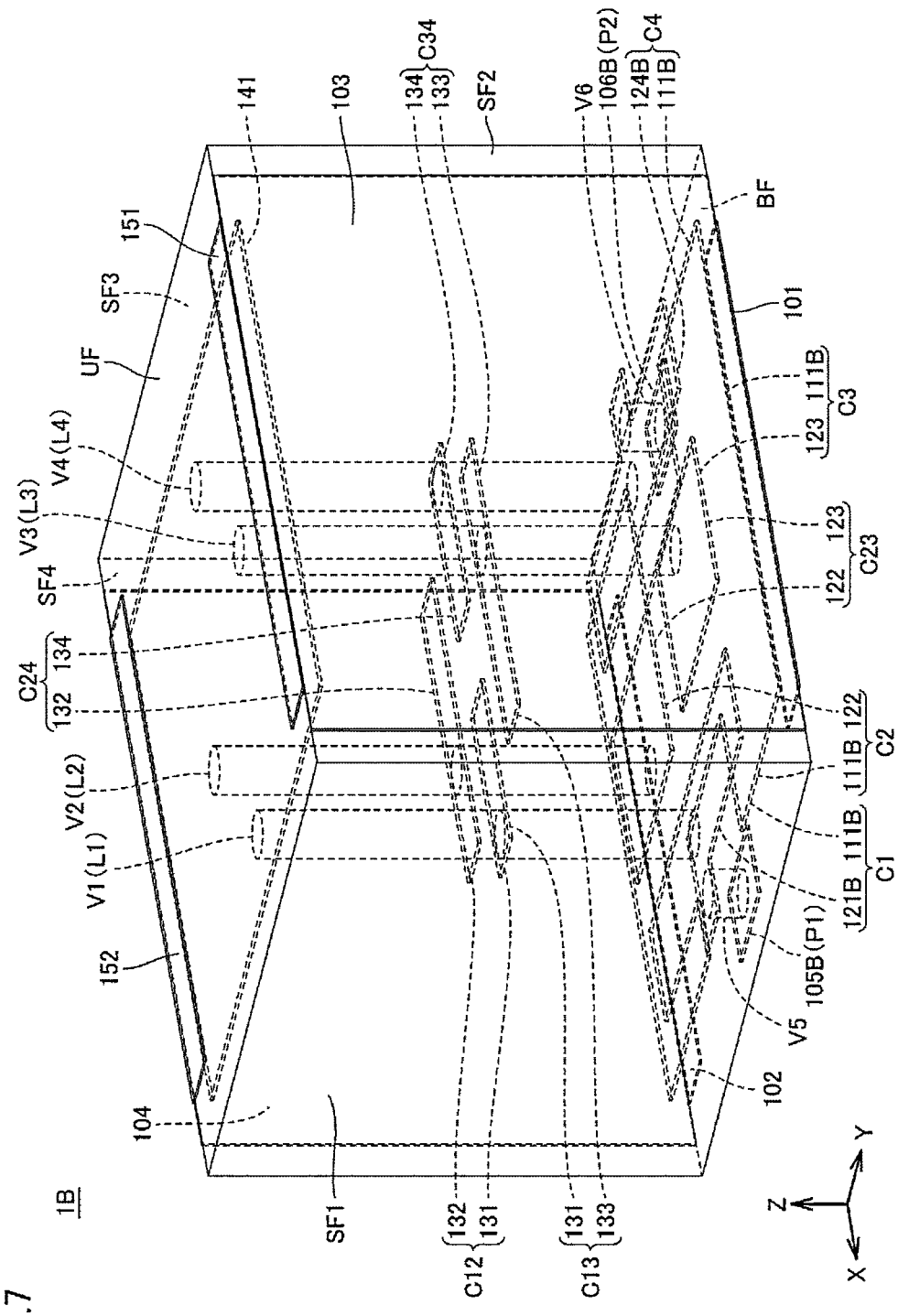
FIG. 7 is an outer appearance perspective view of a band pass filter which is an example of an LC filter according to Modification 2 of Preferred Embodiment 1 of the present invention.
Figure 8:
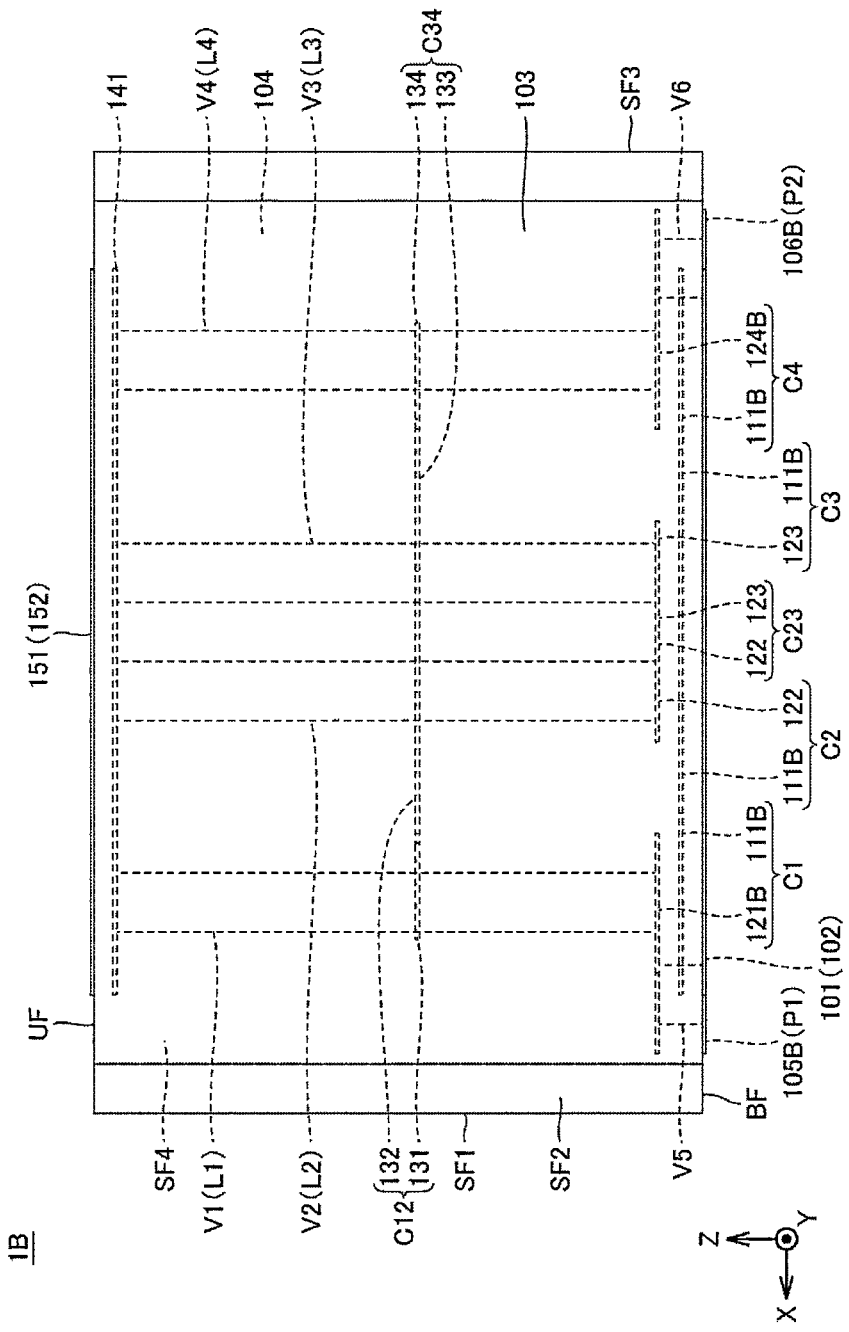
FIG. 8 is a plan view of a side surface of the band pass filter of FIG. 7 viewed from the Y-axis direction.

FIG. 7 is an outer appearance perspective view of a band pass filter 1B, which is an example of an LC filter according to Modification 2 of Preferred Embodiment 1. FIG. 8 is a plan view of the side surface SF2 of the band pass filter 1B of FIG. 7 viewed from the Y-axis direction. A configuration of the band pass filter 1B is the same as or similar to the configuration of the band pass filter 1 of FIG. 2, except that the side surface electrodes 105 and 106, the ground electrode 111, and the capacitor electrodes 121 and 124 of the band pass filter 1 are replaced with LGA terminals 105B and 106B, a ground electrode 111B, and capacitor electrodes 121B and 124B, respectively and via conductors V5 and V6 are included, and repeated description of the same or similar points is omitted.

As illustrated in FIGS. 7 and 8, the LGA terminal 105B and the capacitor electrode 121B are connected by the via conductor V5. The LGA terminal 106B and the capacitor electrode 124B are connected by the via conductor V6.

Modification 3 of Preferred Embodiment 1

In Preferred Embodiment 1, a configuration in which one end of an inductor of an LC resonator included in an LC filter is an open end has been described. In Modification 3 of Preferred Embodiment 1, a configuration in which both ends of the inductor are open ends is described.

Figure 9:
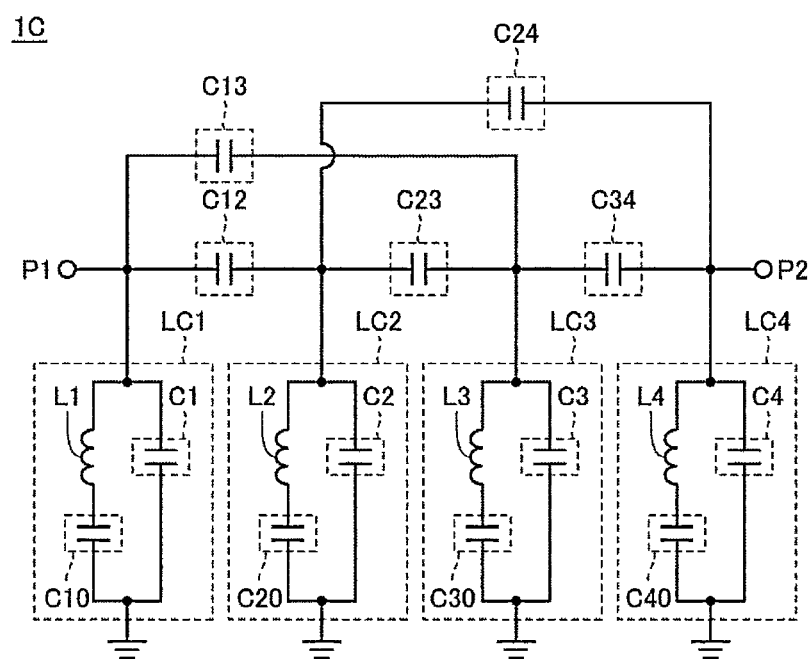
FIG. 9 is an equivalent circuit diagram of a band pass filter which is an example of an LC filter according to Modification 3 of Preferred Embodiment 1 of the present invention.

FIG. 9 is an equivalent circuit diagram of a band pass filter 1C, which is an example of an LC filter according to Modification 3 of Preferred Embodiment 1. The equivalent circuit diagram illustrated in FIG. 9 is the same as or similar to the equivalent circuit diagram illustrated in FIG. 1, except that capacitors C10, C20, C30, and C40 are added to the LC parallel resonators LC1 to LC4 of the equivalent circuit diagram illustrated in FIG. 1, and repeated description of the same or similar points is omitted.

As illustrated in FIG. 9, the capacitor C10 is connected between the inductor L1 and the ground point. The capacitor C20 is connected between the inductor L2 and the ground point. The capacitor C30 is connected between the inductor L3 and the ground point. The capacitor C40 is connected between the inductor L4 and the ground point.

Figure 10:
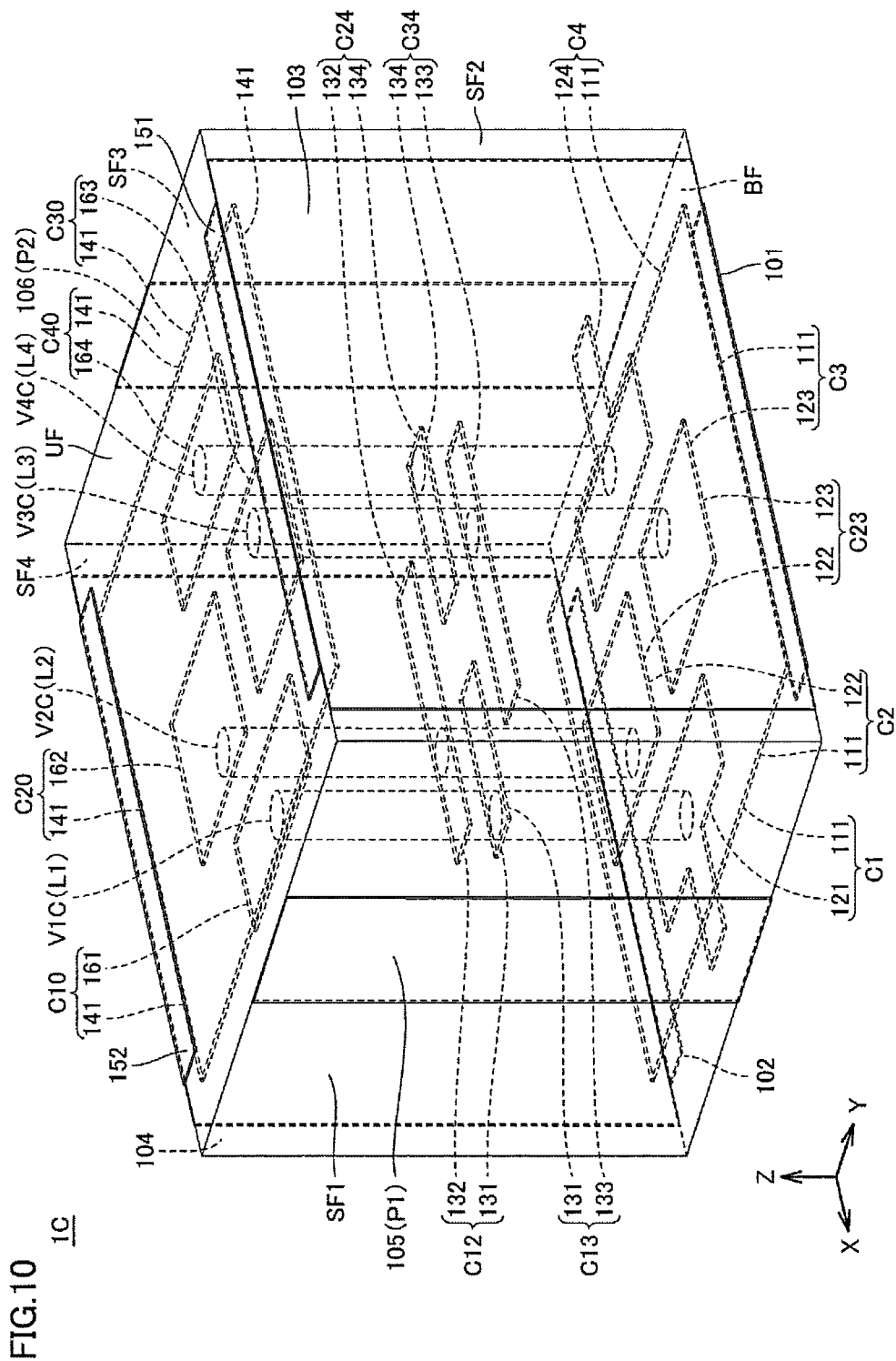
FIG. 10 is an outer appearance perspective view of the band pass filter of FIG. 9.
Figure 11:
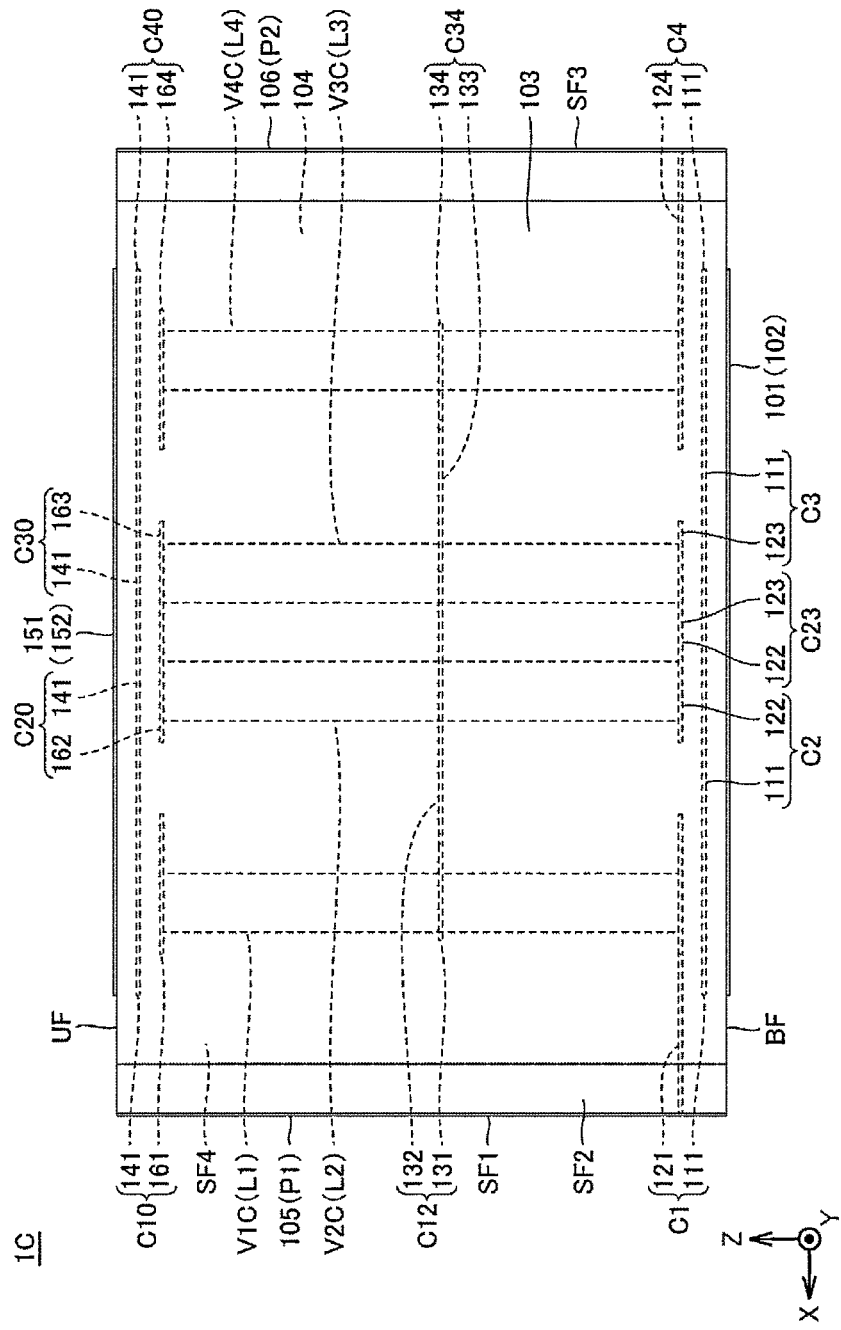
FIG. 11 is a plan view of a side surface of the band pass filter of FIG. 10 viewed from the Y-axis direction.

FIG. 10 is an outer appearance perspective view of the band pass filter 1C of FIG. 9. FIG. 11 is a plan view of the side surface SF2 of the band pass filter 1C of FIG. 10 viewed from the Y-axis direction. A configuration of the band pass filter 1C is the same as or similar to the configuration of the band pass filter of FIG. 1, except that capacitor electrodes 161 to 164 are included and the via conductors V1 to V4 are replaced with V1C to V4C, respectively, and repeated description of the same or similar points is omitted.

As illustrated in FIGS. 10 and 11, the capacitor electrode 161 (fifth capacitor electrode) faces the ground electrode 141. The capacitor electrodes 161 and the ground electrode 141 define the capacitor C10.

The via conductor V1C (first via conductor) defines the inductor L1. One end of the via conductor V1C is connected to the capacitor electrode 121. The one end of the via conductor V1C is an open end that is galvanically isolated from the ground electrode 111 by the capacitor electrode 121. The other end of the via conductor V1C is connected to the capacitor electrode 161. The other end of the via conductor V1C is an open end that is galvanically isolated from the ground electrode 141 by the capacitor electrode 161. Since both ends of the via conductor V1C are open ends, the LC parallel resonator LC1 in FIG. 9 is, for example, a $\lambda/2$ resonator. A length of the via conductor V1C is equal or substantially equal to $\lambda/2$.

The capacitor electrode 162 (sixth capacitor electrode) faces the ground electrode 141. The capacitor electrode 162 and the ground electrode 141 define the capacitor C20.

The via conductor V2C (second via conductor) defines the inductor L2. One end of the via conductor V2C is connected to the capacitor electrode 122. The one end of the via conductor V2C is an open end that is galvanically isolated from the ground electrode 111 by the capacitor electrode 122. The other end of the via conductor V2C is connected to the capacitor electrode 162. The other end of the via conductor V2C is an open end that is galvanically isolated from the ground electrode 141 by the capacitor electrode 162. Since both ends of the via conductor V2C are open ends, the LC parallel resonator LC2 in FIG. 9 is, for example, a $\lambda/2$ resonator. A length of the via conductor V2C is equal or substantially equal to $\lambda/2$.

The capacitor electrode 163 (eighth capacitor electrode) faces the ground electrode 141. The capacitor electrode 163 and the ground electrode 141 define the capacitor C30.

The via conductor V3C (fourth via conductor) defines the inductor L3. One end of the via conductor V3C is connected to the capacitor electrode 123. One end of the via conductor V3C is an open end that is galvanically isolated from the ground electrode 111 by the capacitor electrode 123. The other end of the via conductor V3C is connected to the capacitor electrode 163. The other end of the via conductor V3C is an open end that is galvanically isolated from the ground electrode 141 by the capacitor electrode 163. Since both ends of the via conductor V3C are open ends, the LC parallel resonator LC3 in FIG. 9 is, for example, a $\lambda/2$ resonator. A length of the via conductor V3C is equal or substantially equal to $\lambda/2$.

The capacitor electrode 164 (seventh capacitor electrode) faces the ground electrode 141. The capacitor electrode 164 and the ground electrode 141 define the capacitor C40.

The via conductor V4C (third via conductor) defines the inductor L4. One end of the via conductor V4C is connected to the capacitor electrode 124. One end of the via conductor V4C is an open end that is galvanically isolated from the ground electrode 111 by the capacitor electrode 124. The other end of the via conductor V4C is connected to the capacitor electrode 164. The other end of the via conductor V4C is an open end that is galvanically isolated from the ground electrode 141 by the capacitor electrode 164. Since both ends of the via conductor V4C are open ends, the LC parallel resonator LC4 is, for example, a $\lambda/2$ resonator. A length of the via conductor V4C is equal or substantially equal to $\lambda/2$.

As described above, according to the LC filters according to Preferred Embodiment 1 and Modifications 1 to 3, accuracy of adjustment of bandpass characteristics of the LC filters can be improved.

In Preferred Embodiment 1, a case where the number of LC resonators included in an LC filter is, for example, 4 has been described. The number of LC resonators included in an LC filter according to a preferred embodiment of the present invention is not limited to 4. The following describes an example of a configuration in which an LC filter includes five LC resonators in Preferred Embodiment 2 and an example of a configuration in which an LC filter includes seven LC resonators in Preferred Embodiment 3.

Preferred Embodiment 2

Figure 12:
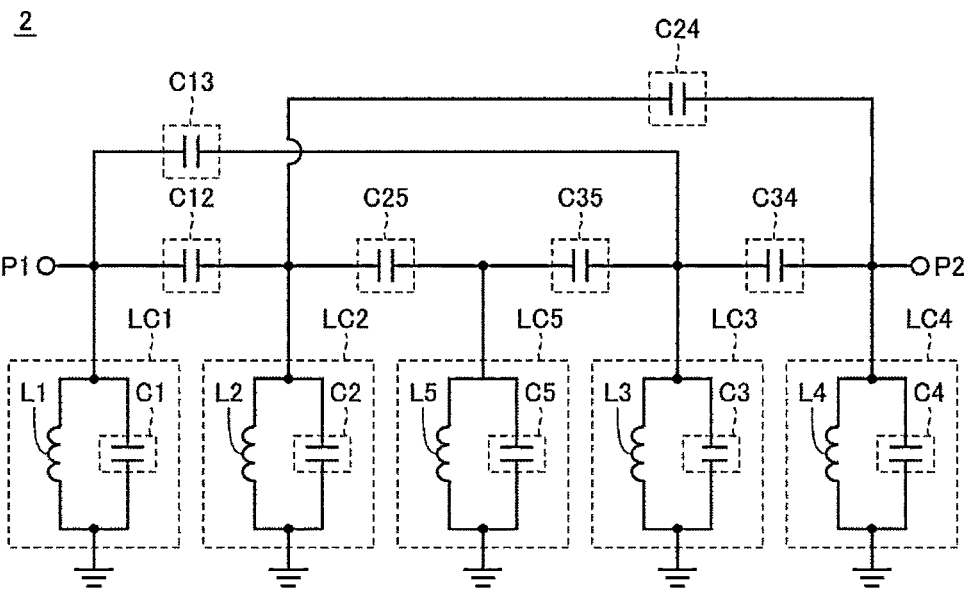
FIG. 12 is an equivalent circuit diagram of a band pass filter which is an example of an LC filter according to Preferred Embodiment 2 of the present invention.

FIG. 12 is an equivalent circuit diagram of a band pass filter 2, which is an example of an LC filter according to Preferred Embodiment 2 of the present invention. The equivalent circuit diagram illustrated in FIG. 12 is the same as or similar to the equivalent circuit diagram illustrated in FIG. 1, except that an LC parallel resonator LC5 and capacitors C25 and C35 are added. That is, five LC resonators are sequentially coupled to define a five-stage LC filter. Repeated description of the same or similar points is omitted.

As illustrated in FIG. 12, the LC parallel resonator LC5 is disposed between LC parallel resonators LC2 and LC3.

The capacitor C25 is connected between LC parallel resonators LC2 and LC5. The capacitor C25 represents capacitive coupling between the LC parallel resonators LC2 and LC5.

The capacitor C35 is connected between LC parallel resonators LC3 and LC5. The capacitor C35 represents capacitive coupling between the LC parallel resonators LC3 and LC5.

The LC parallel resonator LC5 includes an inductor L5 and a capacitor C5. The inductor L5 and the capacitor C5 are connected in parallel between a ground point and a connection point between the capacitors C25 and C35.

Figure 13:
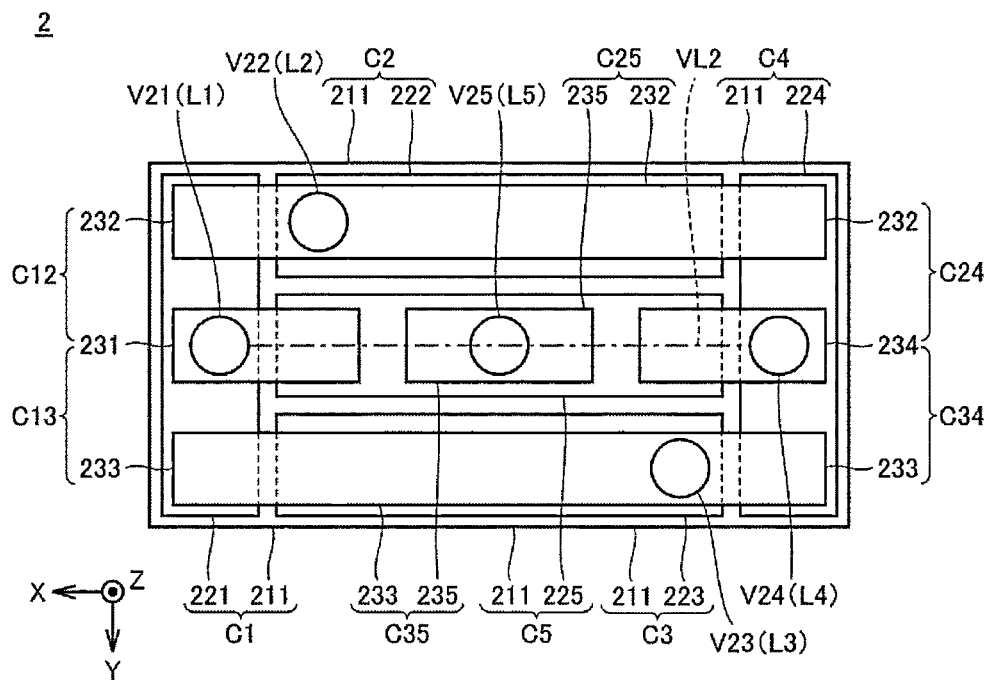
FIG. 13 is a plan view of the band pass filter of FIG. 12 viewed from the Z-axis direction.

FIG. 13 is a plan view of the band pass filter 2 of FIG. 12 viewed from the Z-axis direction. FIG. 13 illustrates main electrodes that define the LC parallel resonators LC1 to LC5 of FIG. 12 to emphasize features of the band pass filter 2. As illustrated in FIG. 13, the band pass filter 2 includes a ground electrode 211, via conductors V21 to V25, plane electrodes 231 to 235, and capacitor electrodes 221 to 225.

The capacitor electrodes 221 to 225 face the ground electrode 211 in the Z-axis direction and define capacitors C1 to C5 together with the ground electrode 211, respectively. The capacitor electrodes 222, 223, and 225 are disposed between the capacitor electrodes 221 and 224 in the X-axis direction. The capacitor electrode 225 is disposed between the capacitor electrodes 222 and 223 in the Y-axis direction.

One end of the via conductor V21 (first via conductor) is connected to the capacitor electrode 221 (first capacitor electrode). The via conductor V21 defines an inductor L1.

One end of the via conductor V22 (second via conductor) is connected to the capacitor electrode 222 (second capacitor electrode). The via conductor V22 defines an inductor L2.

One end of the via conductor V23 (fourth via conductor) is connected to the capacitor electrode 223 (fourth capacitor electrode). The via conductor V23 defines an inductor L3.

One end of the via conductor V24 (third via conductor) is connected to the capacitor electrode 224 (third capacitor electrode). The via conductor V24 define an inductor L4.

One end of the via conductor V25 is connected to the capacitor electrode 225. The via conductor V25 defines an inductor L5.

The via conductors V22 and V23 are disposed on both sides of a virtual line VL2 connecting the via conductors V21 and V24, respectively. The via conductor V25 is disposed on the virtual line VL2.

For example, in Preferred Embodiment 2, it is assumed that magnetic coupling is dominant over capacitive coupling. A distance between the via conductors V21 and V22 is shorter than a distance between the via conductors V21 and V25. Accordingly, magnetic coupling between the LC parallel resonators LC1 and LC2 is stronger than magnetic coupling between the LC parallel resonators LC1 and LC5.

A distance between the via conductors V24 and V23 is shorter than a distance between the via conductors V24 and V25. Accordingly, magnetic coupling between the LC parallel resonators LC4 and LC3 is stronger than magnetic coupling between the LC parallel resonators LC4 and LC5. As a result, the LC parallel resonators LC1, LC2, LC5, LC3, and LC4 are coupled in this order from the input/output terminal P1 side to define a five-stage LC filter.

The plane electrode 231 (first electrode) is connected to the via conductor V21 between both ends of the via conductor V21. The plane electrode 232 (second electrode) is connected to the via conductor V22 between both ends of the via conductor V22. The plane electrode 233 (fourth electrode) is connected to the via conductor V23 between both ends of the via conductor V23. The plane electrode 234 (third electrode) is connected to the via conductor V24 between both ends of the via conductor V24. The plane electrode 235 is connected to the via conductor V25 between both ends of the via conductor V25.

The plane electrode 232 faces the plane electrodes 231, 234, and 235 in the Y-axis direction. The plane electrodes 231 and 232 define the capacitor C12. The plane electrodes 232 and 234 define the capacitor C24. The plane electrodes 232 and 235 define the capacitor C25.

The plane electrode 233 faces the plane electrodes 231, 234, and 235 in the Y-axis direction. The plane electrodes 231 and 233 define the capacitor C13. The plane electrodes 233 and 234 define the capacitor C34. The plane electrodes 233 and 235 define the capacitor C35.

As described above, according to the LC filter according to Preferred Embodiment 2, accuracy of adjustment of characteristics of the LC filter can be improved.

Preferred Embodiment 3

Figure 14:
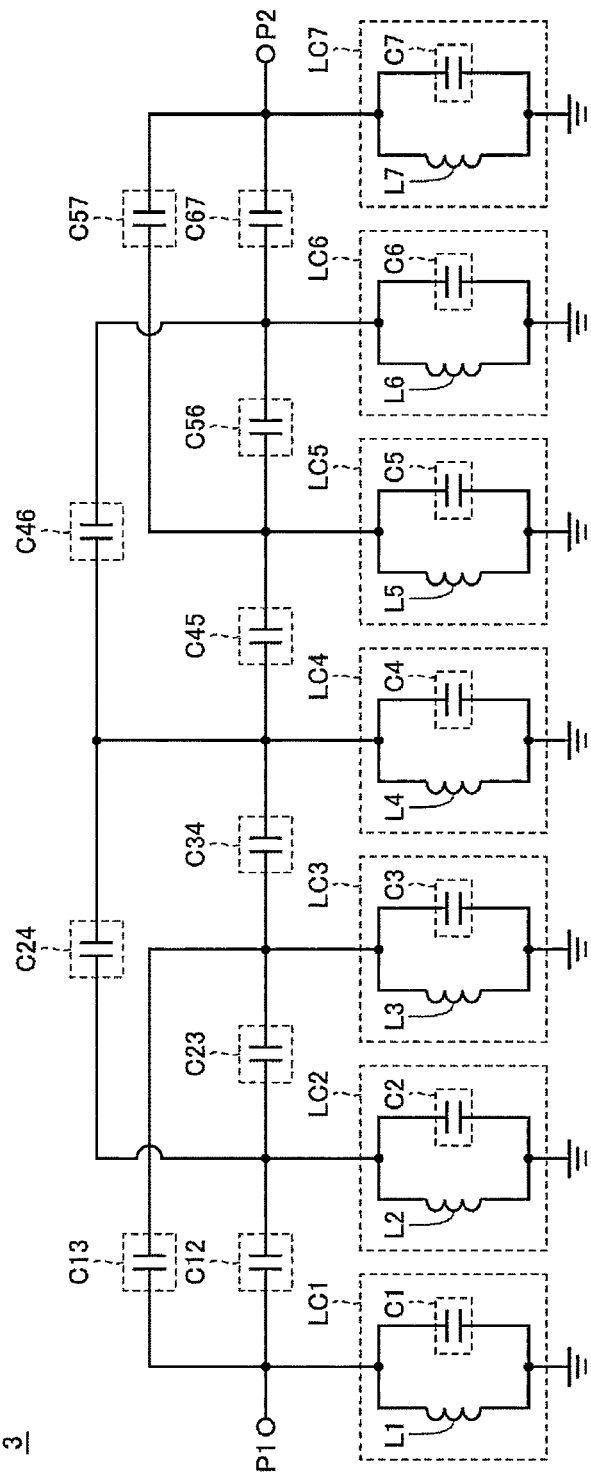
FIG. 14 is an equivalent circuit diagram of a band pass filter which is an example of an LC filter according to Preferred Embodiment 3 of the present invention.

FIG. 14 is an equivalent circuit diagram of a band pass filter 3, which is an example of an LC filter according to Preferred Embodiment 3 of the present invention. The equivalent circuit diagram illustrated in FIG. 14 is the same as or similar to the equivalent circuit diagram illustrated in FIG. 1, except that LC parallel resonators LC5 to LC7 and capacitors C45, C46, C56, C57, and C67 are included. That is, seven LC resonators are sequentially coupled to define a seven-stage LC filter. Repeated description of the same or similar points is omitted.

As illustrated in FIG. 14, the LC parallel resonators LC5 and LC6 are disposed between LC parallel resonators LC4 and LC7.

The capacitor C45 is connected between the LC parallel resonators LC4 and LC5. The capacitor C45 represents capacitive coupling between the LC parallel resonators LC4 and LC5.

The capacitor C46 is connected between the LC parallel resonators LC4 and LC6. The capacitor C46 represents capacitive coupling between the LC parallel resonators LC4 and LC6.

The capacitor C56 is connected between the LC parallel resonators LC5 and LC6. The capacitor C56 represents capacitive coupling between the LC parallel resonators LC5 and LC6.

The capacitor C57 is connected between the LC parallel resonators LC5 and LC7. The capacitor C57 represents capacitive coupling between the LC parallel resonators LC5 and LC7.

The capacitor C67 is connected between the LC parallel resonators LC6 and LC7. The capacitor C67 represents capacitive coupling between the LC parallel resonators LC6 and LC7.

The LC parallel resonator LC5 includes an inductor L5 and a capacitor C5. The inductor L5 and the capacitor C5 are connected in parallel between a ground point and a connection point between the capacitors C45 and C56.

The LC parallel resonator LC6 includes an inductor L6 and a capacitor C6. The inductor L6 and the capacitor C6 are connected in parallel between a ground point and a connection point between the capacitors C56 and C67.

The LC parallel resonator LC7 includes an inductor L7 and a capacitor C7. The inductor L7 and the capacitor C7 are connected in parallel between a ground point and a connection point between the capacitor C67 and an input/output terminal P2.

Figure 15:
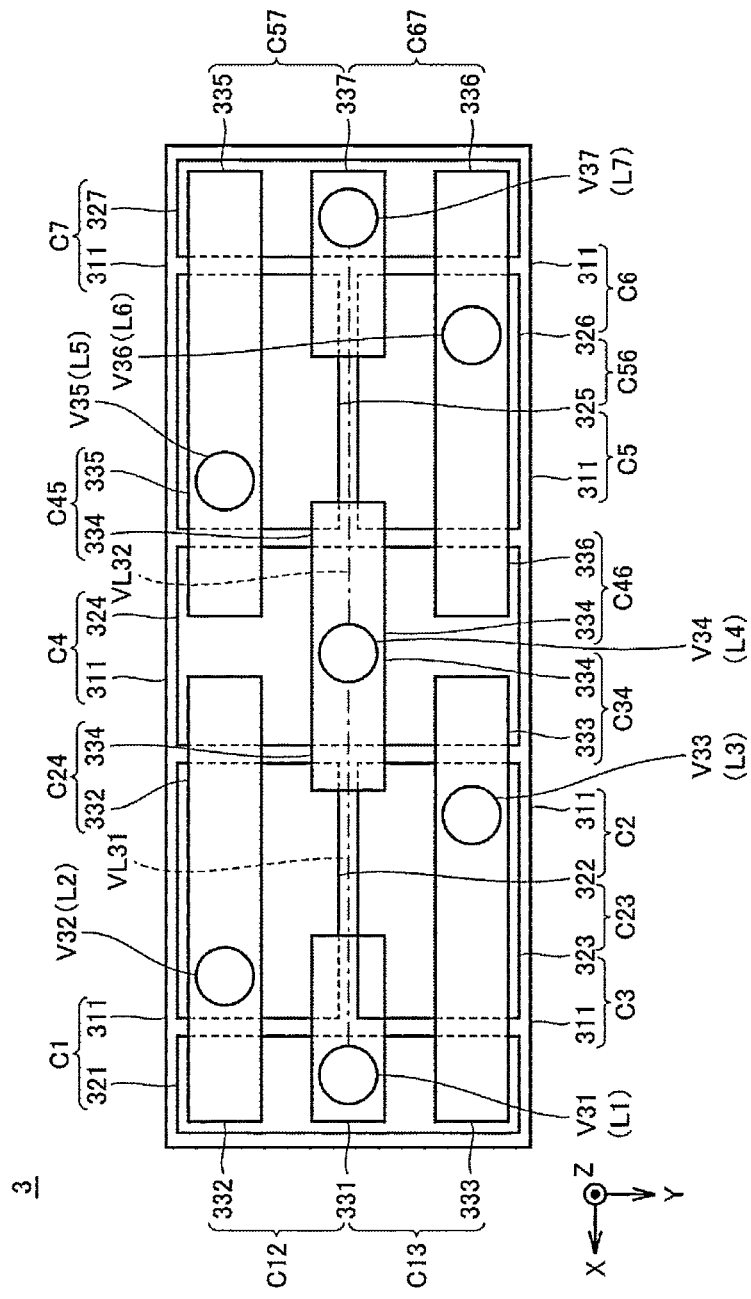
FIG. 15 is a plan view of the band pass filter of FIG. 14 viewed from the Z-axis direction.

FIG. 15 is a plan view of the band pass filter 3 of FIG. 14 viewed from the Z-axis direction. FIG. 15 illustrates main electrodes that define the LC parallel resonators LC1 to LC7 of FIG. 14 to emphasize features of the band pass filter 3. As illustrated in FIG. 15, the band pass filter 3 includes a ground electrode 311 (first ground electrode), via conductors V31 to V37, plane electrodes 331 to 337, and capacitor electrodes 321 to 327.

The capacitor electrodes 321 to 327 face the ground electrode 311 in the Z-axis direction and define capacitors C1 to C7 together with the ground electrode 311, respectively. The capacitor electrodes 322 and 323 are disposed between the capacitor electrodes 321 and 324 in the X-axis direction. The capacitor electrodes 322 and 323 are disposed side by side in the Y-axis direction. The capacitor electrodes 325 and 326 are disposed between the capacitor electrodes 324 and 327 in the X-axis direction. The capacitor electrodes 325 and 326 are disposed side by side in the Y-axis direction.

One end of the via conductor V31 (first via conductor) is connected to the capacitor electrode 321 (first capacitor electrode). The via conductor V31 defines an inductor L1.

One end of the via conductor V32 (second via conductor) is connected to the capacitor electrode 322 (second capacitor electrode). The via conductor V32 defines an inductor L2.

One end of the via conductor V33 (fourth via conductor) is connected to the capacitor electrode 323 (fourth capacitor electrode). The via conductor V33 defines an inductor L3.

One end of the via conductor V34 (third via conductor) is connected to the capacitor electrode 324 (third capacitor electrode). The via conductor V34 defines an inductor L4.

One end of the via conductor V35 is connected to the capacitor electrode 325. The via conductor V35 defines an inductor L5.

One end of the via conductor V36 is connected to the capacitor electrode 326. The via conductor V36 defines an inductor L6.

One end of the via conductor V37 is connected to the capacitor electrode 327. The via conductor V37 defines an inductor L7.

The via conductors V32 and V33 are disposed on both sides of a virtual line VL31 connecting the via conductors V31 and V34, respectively. The via conductors V35 and V36 are disposed on both sides of a virtual line VL32 connecting the via conductors V34 and V37, respectively.

For example, in Preferred Embodiment 3, it is assumed that magnetic coupling is dominant over capacitive coupling. A distance between the via conductors V31 and V32 is shorter than a distance between the via conductors V31 and V33. Accordingly, magnetic coupling between the LC parallel resonators LC1 and LC2 is stronger than magnetic coupling between the LC parallel resonators LC1 and LC3.

A distance between the via conductors V34 and V33 is shorter than a distance between the via conductors V34 and V32. Accordingly, magnetic coupling between the LC parallel resonators LC4 and LC3 is stronger than magnetic coupling between the LC parallel resonators LC4 and LC2.

A distance between the via conductors V34 and V35 is shorter than a distance between the via conductors V34 and V36. Accordingly, magnetic coupling between the LC parallel resonators LC4 and LC5 is stronger than magnetic coupling between the LC parallel resonators LC4 and LC6.

A distance between the via conductors V37 and V36 is shorter than a distance between the via conductors V37 and V35. Accordingly, magnetic coupling between the LC parallel resonators LC7 and LC6 is stronger than magnetic coupling between the LC parallel resonators LC7 and LC5. As a result, the LC parallel resonators LC1, LC2, LC3, LC4, LC5, LC6, and LC7 are coupled in this order from the input/output terminal P1 side to define a seven-stage LC filter.

The plane electrode 331 (first electrode) is connected to the via conductor V31 between both ends of the via conductor V31. The plane electrode 332 (second electrode) is connected to the via conductor V32 between both ends of the via conductor V32. The plane electrode 333 (fourth electrode) is connected to the via conductor V33 between both ends of the via conductor V33. The plane electrode 334 (third electrode) is connected to the via conductor V34 between both ends of the via conductor V34. The plane electrode 335 is connected to the via conductor V35 between both ends of the via conductor V35. The plane electrode 336 is connected to the via conductor V36 between both ends of the via conductor V36. The plane electrode 337 is connected to the via conductor V37 between both ends of the via conductor V37.

The plane electrode 332 faces the plane electrodes 331 and 334 in the Y-axis direction. The plane electrodes 331 and 332 define the capacitor C12. The plane electrodes 332 and 334 define the capacitor C24.

The plane electrode 333 faces the plane electrodes 331 and 334 in the Y-axis direction. The plane electrodes 331 and 333 define the capacitor C13. The plane electrodes 333 and 334 define the capacitor C34.

The capacitor electrode 322 faces the capacitor electrode 323 in the Y-axis direction. The capacitor electrodes 322 and 323 define the capacitor C23.

The plane electrode 335 faces the plane electrodes 334 and 337 in the Y-axis direction. The plane electrodes 334 and 335 define the capacitor C45. The plane electrodes 335 and 337 define the capacitor C57.

The plane electrode 336 faces the plane electrodes 334 and 337 in the Y-axis direction. The plane electrodes 334 and 336 define the capacitor C46. The plane electrodes 336 and 337 define the capacitor C67.

The capacitor electrode 325 faces the capacitor electrode 326 in the Y-axis direction. The capacitor electrodes 325 and 326 define the capacitor C56.

As described above, according to the LC filter according to Preferred Embodiment 3, accuracy of adjustment of characteristics of the LC filter can be improved.

Preferred Embodiment 4

In Preferred Embodiment 1, a configuration in which a plurality of LC resonators included in an LC filter are disposed in a staggered manner has been described. In Preferred Embodiment 4 of the present invention, a configuration in which the plurality of LC resonators are disposed in a straight manner is described.

Figure 16:
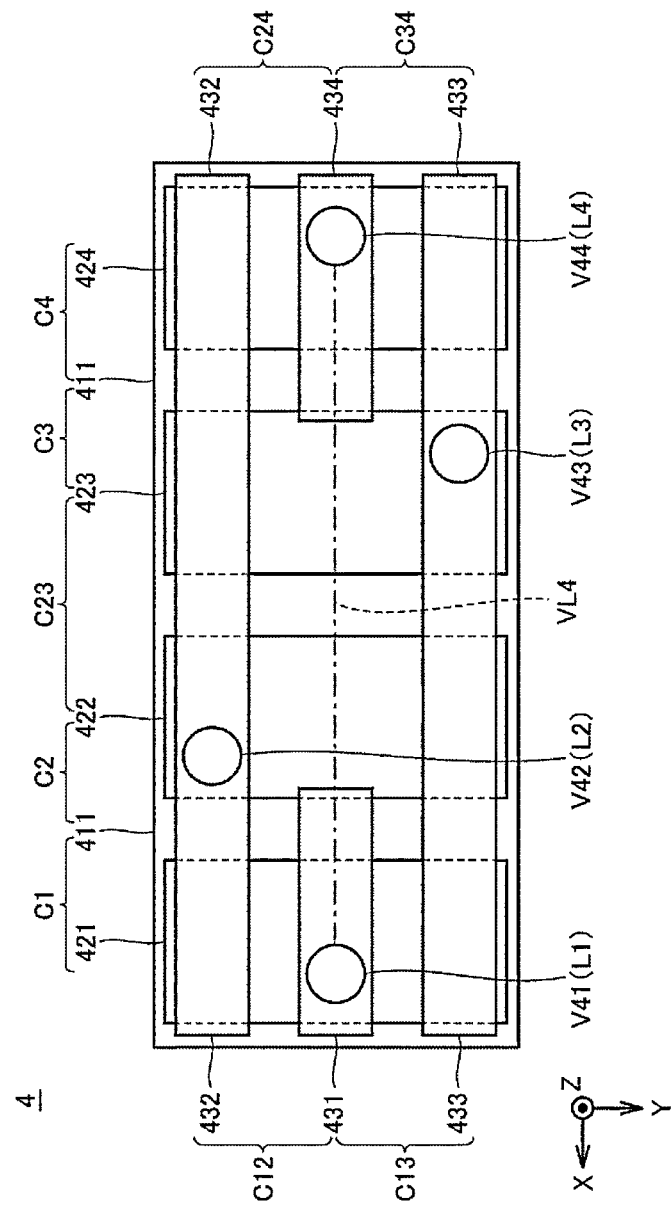
FIG. 16 is a plan view of a band pass filter, which is an example of an LC filter according to Preferred Embodiment 4 of the present invention, viewed from the Z-axis direction.

FIG. 16 is a plan view of a band pass filter 4, which is an example of an LC filter according to Preferred Embodiment 4, viewed from the Z-axis direction. The equivalent circuit diagram of the band pass filter 4 is the same as or similar to FIG. 1. FIG. 16 illustrates main electrodes that define the LC parallel resonators LC1 to LC4 of FIG. 1 to emphasize features of the band pass filter 4.

As illustrated in FIG. 16, the band pass filter 4 includes a ground electrode 411, via conductors V41 to V44, plane electrodes 431 to 434, and capacitor electrodes 421 to 424.

The capacitor electrodes 421 to 424 face the ground electrode 411 in the Z-axis direction and define capacitors C1 to C4 together with the ground electrode 411, respectively. The capacitor electrodes 422 and 423 are disposed between the capacitor electrodes 421 and 424 in the X-axis direction. The capacitor electrodes 421 to 424 are disposed side by side on a straight line in the X-axis direction.

One end of the via conductor V41 (first via conductor) is connected to the capacitor electrode 421 (first capacitor electrode). The via conductor V41 defines an inductor L1.

One end of the via conductor V42 (second via conductor) is connected to the capacitor electrode 422 (second capacitor electrode). The via conductor V42 defines an inductor L2.

One end of the via conductor V43 (fourth via conductor) is connected to the capacitor electrode 423 (fourth capacitor electrode). The via conductor V43 defines an inductor L3.

One end of the via conductor V44 (third via conductor) is connected to the capacitor electrode 424 (third capacitor electrode). The via conductor V44 defines an inductor L4.

The via conductors V42 and V43 are disposed on both sides of a virtual line VL4 connecting the via conductors V41 and V44, respectively.

A distance between the via conductors V41 and V42 is shorter than a distance between the via conductors V41 and V43. Accordingly, magnetic coupling between the via conductors V41 and V42 is stronger than magnetic coupling between the via conductors V41 and V43.

A distance between the via conductors V44 and V43 is shorter than a distance between the via conductors V44 and V42. Accordingly, magnetic coupling between the via conductors V44 and V43 is stronger than magnetic coupling between the via conductors V44 and V42.

The plane electrode 431 (first electrode) is connected to the via conductor V41 between both ends of the via conductor V41. The plane electrode 432 (second electrode) is connected to the via conductor V42 between both ends of the via conductor V42. The plane electrode 433 (fourth electrode) is connected to the via conductor V43 between both ends of the via conductor V43. The plane electrode 434 (third electrode) is connected to the via conductor V44 between both ends of the via conductor V44.

The plane electrode 432 faces the plane electrodes 431 and 434 in the Y-axis direction. The plane electrodes 431 and 432 define a capacitor C12. The plane electrodes 432 and 434 define a capacitor C24.

The plane electrode 433 faces the plane electrodes 431 and 434 in the Y-axis direction. The plane electrodes 431 and 433 define a capacitor C13. The plane electrodes 433 and 434 define a capacitor C34.

The capacitor electrode 422 faces the capacitor electrode 423 in the X-axis direction. The capacitor electrodes 422 and 423 define a capacitor C23.

As described above, according to the LC filter according to Preferred Embodiment 4, accuracy of adjustment of characteristics of the LC filter can be improved.

Preferred Embodiment 5

In Preferred Embodiment 5 of the present invention, an LC filter that further includes an adjustment electrode portion that connect at least two via conductors among a first via conductor, a second via conductor, a third via conductor, and a fourth via conductor is described.

Figure 17:
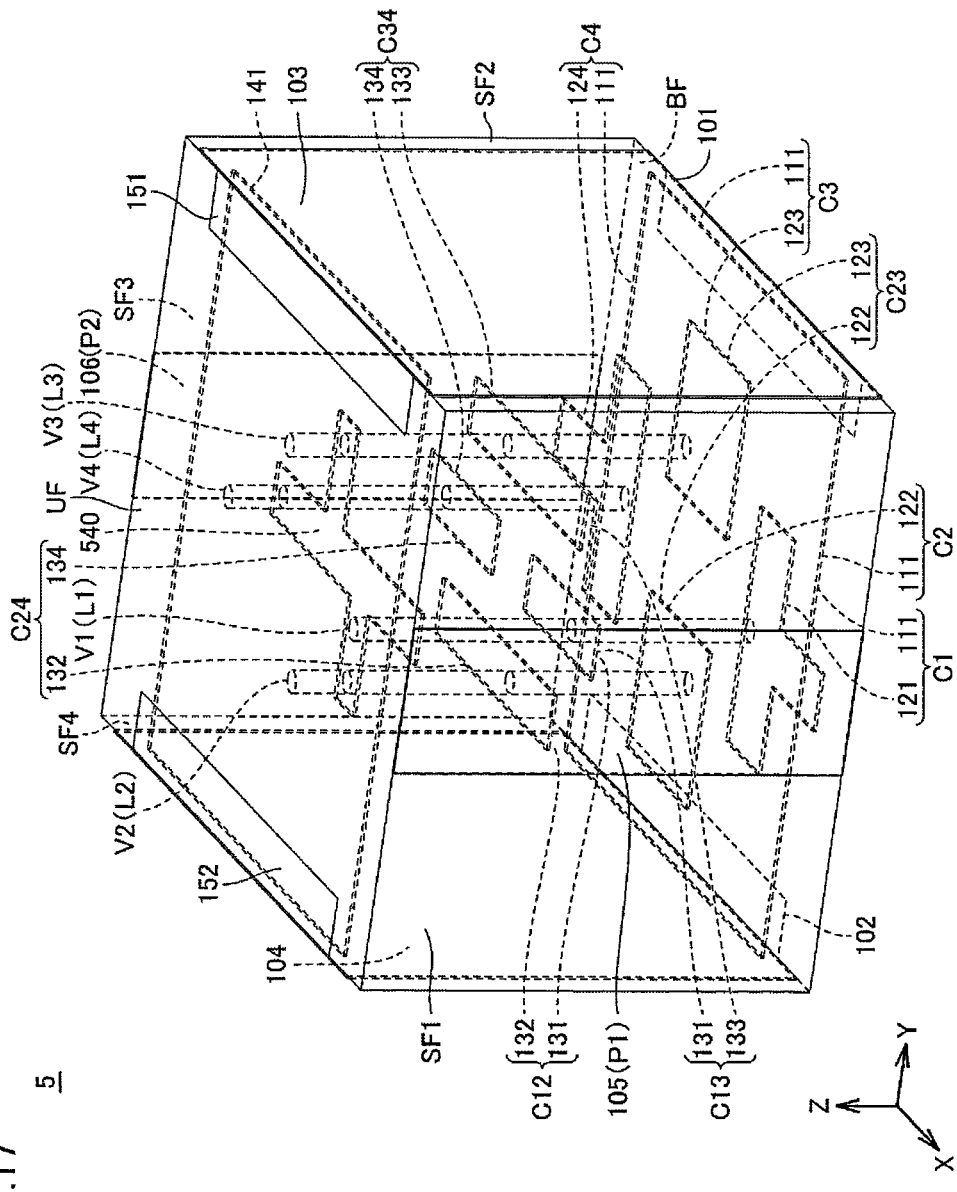
FIG. 17 is an outer appearance perspective view of a band pass filter which is an example of an LC filter according to Preferred Embodiment 5 of the present invention.
Figure 18:
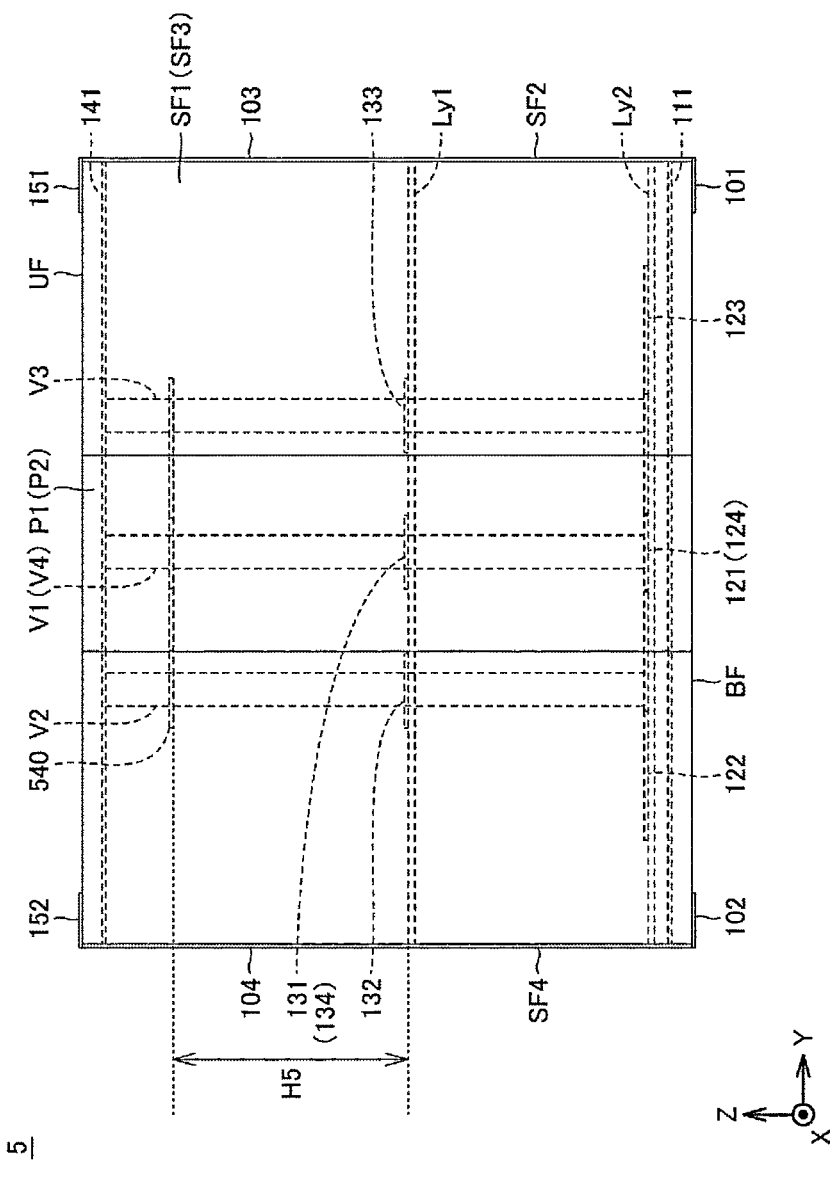
FIG. 18 is a plan view of the band pass filter of FIG. 17 viewed from the X-axis direction.

FIG. 17 is an outer appearance perspective view of a band pass filter 5, which is an example of an LC filter according to Preferred Embodiment 5. FIG. 18 is a plan view of the band pass filter 5 of FIG. 17 viewed from the X-axis direction. A configuration of a band pass filter 5 is the same as or similar to the configuration of the band pass filter 1 of FIG. 2, except that an adjustment electrode 540 (adjustment electrode part) is included. Repeated description of the same or similar points is omitted. As illustrated in FIGS. 17 and 18, the adjustment electrode 540 connects via conductors V1 to V4.

Figure 19:
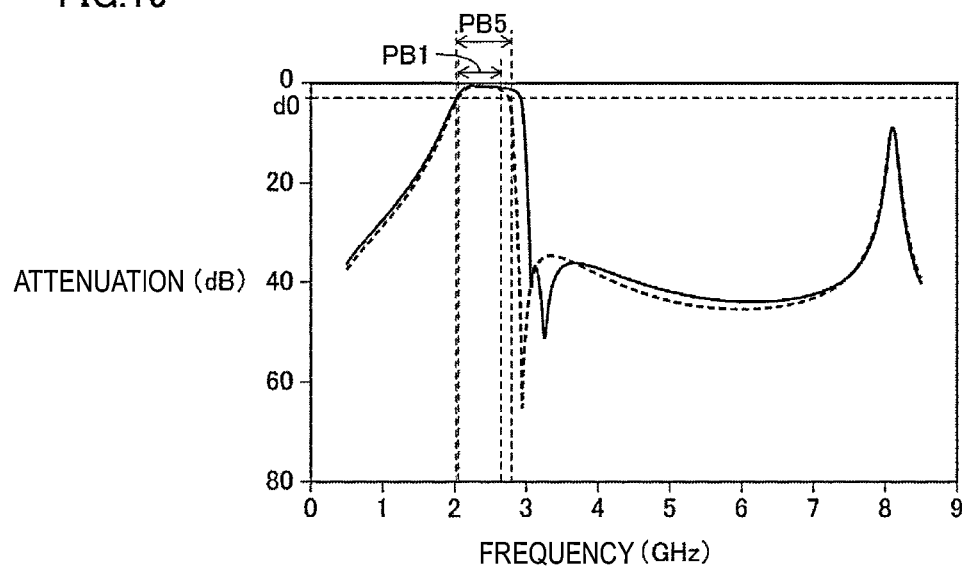
FIG. 19 illustrates bandpass characteristics (solid line) of the band pass filter of FIG. 17 and bandpass characteristics (dotted line) of the band pass filter of FIG. 2.

FIG. 19 illustrates bandpass characteristic (solid line) of the band pass filter 5 of FIG. 17 and bandpass characteristics (dotted line) of the band pass filter 1 of FIG. 2. As illustrated in FIG. 19, a pass band PB5 (a band in which an attenuation is equal to or less than a reference attenuation d0 (e.g., about 3 dB)) of the band pass filter 5 is wider than a pass band PB1 of the band pass filter 1. The band of the band pass filter 5 is widened by the adjustment electrode 540.

Figure 20:
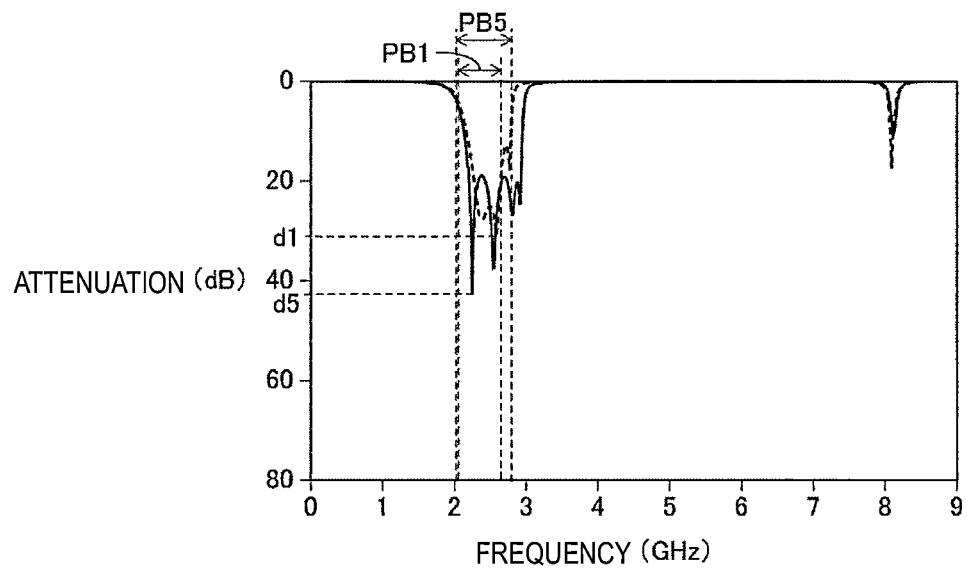
FIG. 20 illustrates reflection characteristics (solid line) of the band pass filter of FIG. 17 and reflection characteristics (dotted line) of the band pass filter of FIG. 2.

FIG. 20 illustrates reflection characteristics (solid line) of the band pass filter 5 of FIG. 17 and reflection characteristics (dotted line) of the band pass filter 1 of FIG. 2. As illustrated in FIG. 20, a maximum value d5 of return loss in the pass band of the band pass filter 5 is larger than a maximum value d1 of return loss in the pass band of the band pass filter 1. The reflection characteristics of the band pass filter 5 are improved by the adjustment electrode 540.

Figure 21:
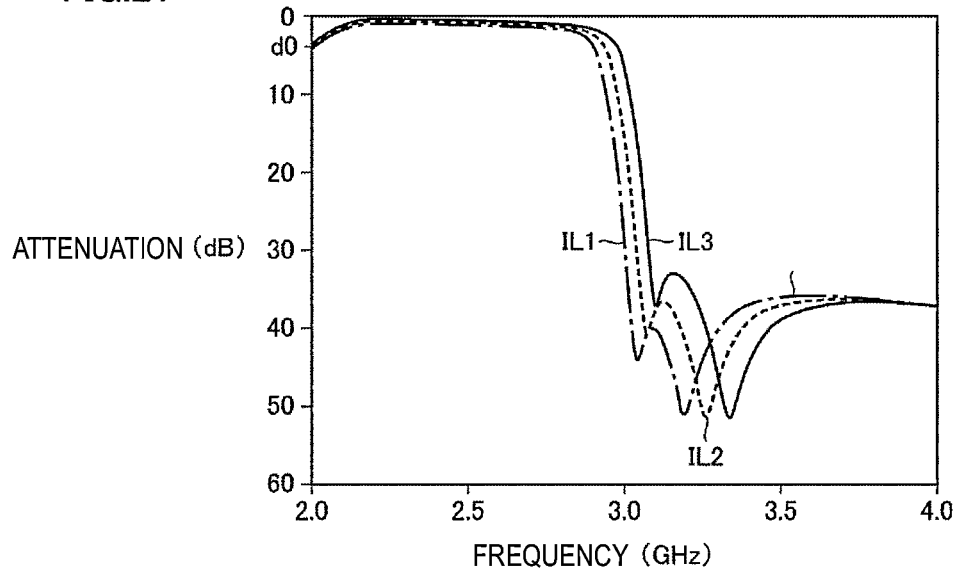
FIG. 21 illustrates a change of bandpass characteristics of the band pass filter in a case where a distance between a dielectric layer and an adjustment electrode in FIG. 18 is changed.

FIG. 21 illustrates a change in bandpass characteristics of the band pass filter 5 in a case where a distance H5 between a dielectric layer Ly1 and the adjustment electrode 540 in FIG. 18 is changed. The distance H5 becomes shorter in an order of curves IL1, IL2, and IL3. As illustrated in FIG. 21, the pass band of the band pass filter 5 can be widened as the distance H5 is reduced.

Figure 22:
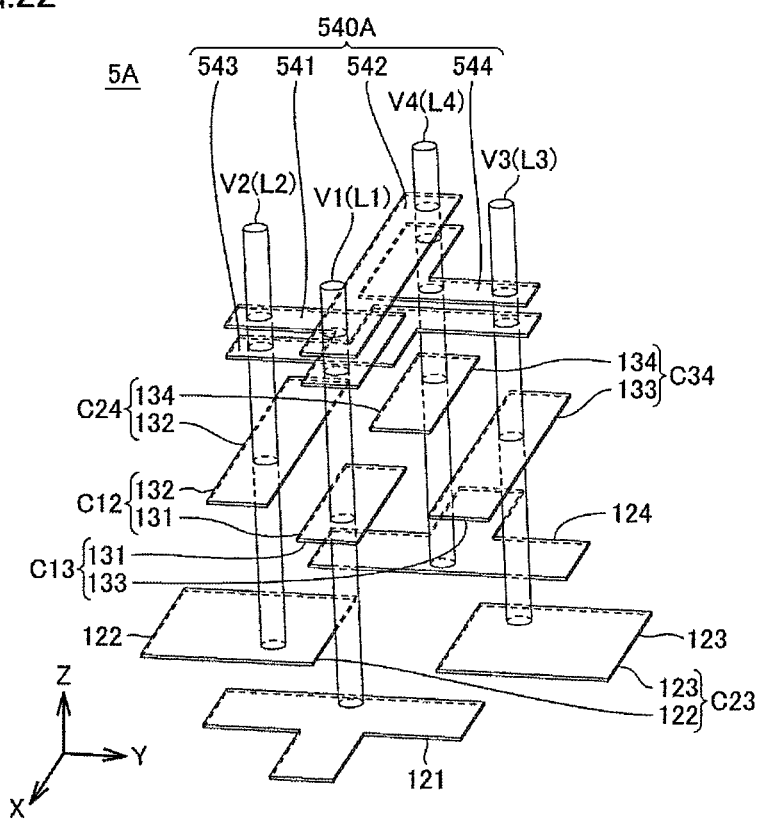
FIG. 22 illustrates an electrode structure of a band pass filter according to Modification 1 of Preferred Embodiment 5 of the present invention.
Figure 23:
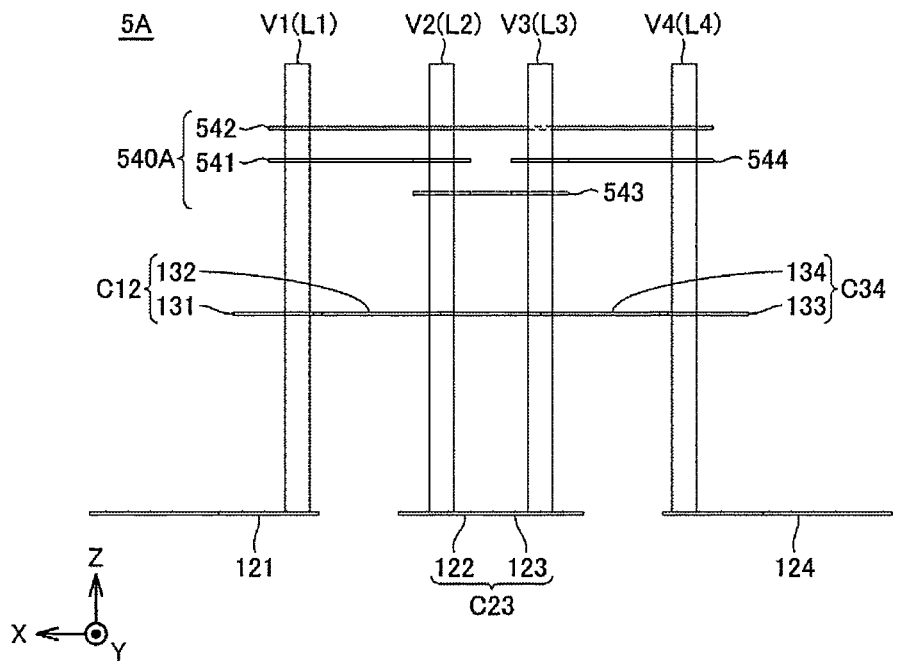
FIG. 23 is a plan view of an electrode structure of the band pass filter of FIG. 22 viewed from the Y-axis direction.

In Preferred Embodiment 5, a case where the adjustment electrode portion is defined by the adjustment electrode 540 and the adjustment electrode connects the via conductors V1 to V4 has been described. The adjustment electrode portion may include a plurality of electrodes. FIG. 22 illustrates an electrode structure of a band pass filter 5A according to Modification 1 of Preferred Embodiment 5. FIG. 23 is a plan view of the electrode structure of the band pass filter 5A of FIG. 22 viewed from the Y-axis direction. A configuration of the band pass filter 5A is the same as or similar to the configuration of FIG. 17, except that the adjustment electrode 540 is replaced with an adjustment electrode portion 540A. Repeated description of the same or similar points is omitted.

As illustrated in FIGS. 22 and 23, the adjustment electrode portion 540A includes an adjustment electrode 541 (first adjustment electrode), an adjustment electrode 542 (second adjustment electrode), an adjustment electrode 543 (third adjustment electrode), and an adjustment electrode 544 (fourth adjustment electrode). The adjustment electrode 541 connects the via conductors V1 and V2. The adjustment electrode 542 connects the via conductors V1 and V4. The adjustment electrode 543 connects the via conductors V2 and V3. The adjustment electrode 544 connects the via conductors V4 and V3.

The adjustment electrode portion may have any electrode configuration as long as the adjustment electrode portion connects at least two via conductors among the via conductors V1 to V4. The following describes a modification in which one or some of the plurality of electrodes included in the adjustment electrode portion 540A illustrated in FIG. 22 is(are) used as an adjustment electrode portion with reference to FIGS. 24 to 27.

Figure 24:
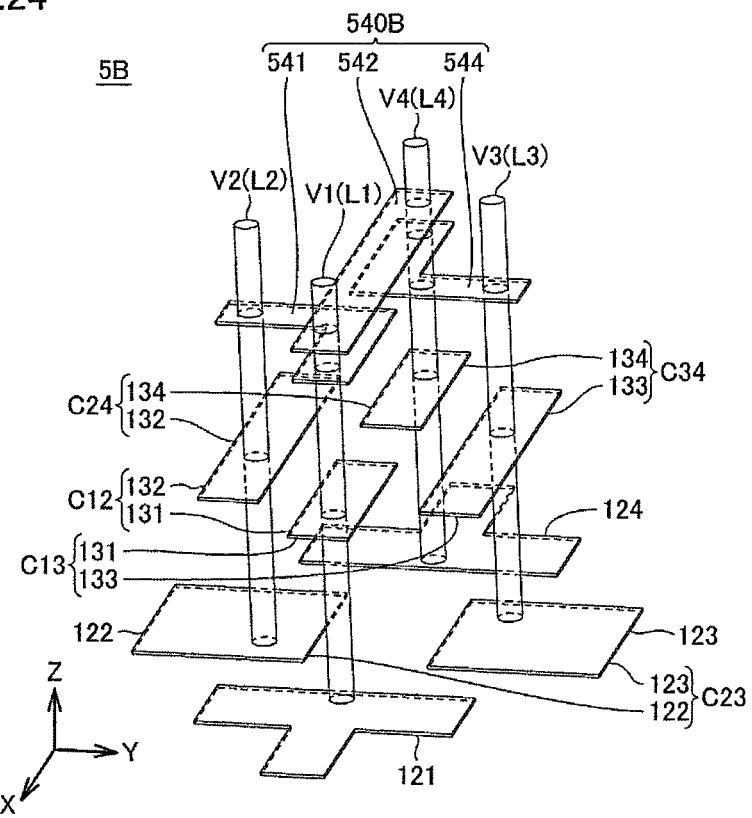
FIG. 24 illustrates an electrode structure of a band pass filter according to Modification 2 of Preferred Embodiment 5 of the present invention.

FIG. 24 illustrates an electrode structure of a band pass filter 5B according to Modification 2 of Preferred Embodiment 5. A configuration of the band pass filter 5B is the same as or similar to the configuration of FIG. 22, except that the adjustment electrode portion 540A is replaced with an adjustment electrode portion 540B. A configuration of the adjustment electrode portion 540B is the same as or similar to the configuration of the adjustment electrode portion 540A, except that the adjustment electrode 543 is excluded. Repeated description of the same or similar points is omitted.

Figure 25:
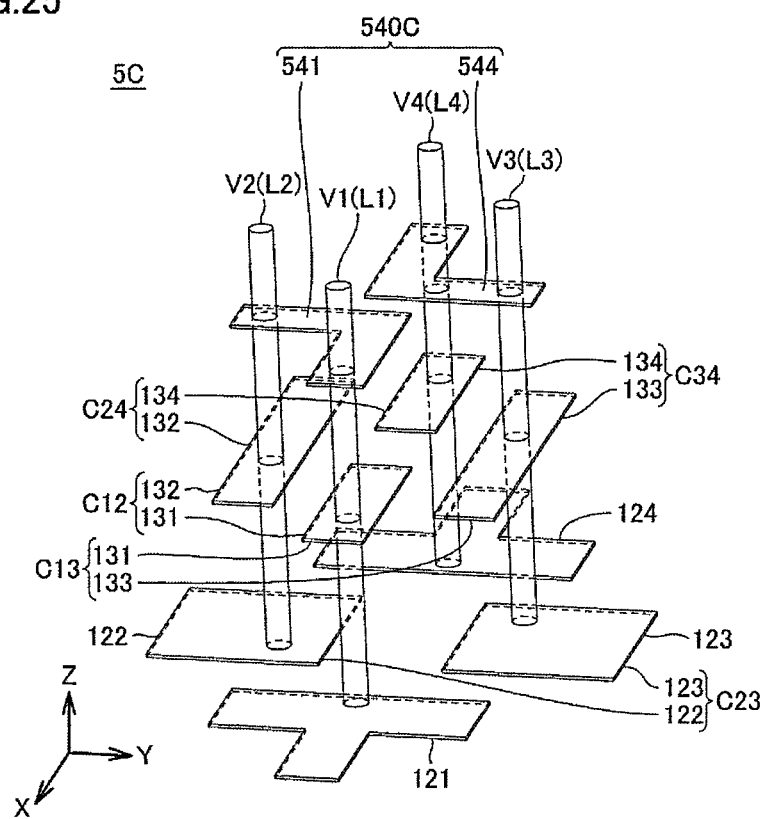
FIG. 25 illustrates an electrode structure of a band pass filter according to Modification 3 of Preferred Embodiment 5 of the present invention.

FIG. 25 illustrates an electrode structure of a band pass filter 5C according to Modification 3 of Preferred Embodiment 5. A configuration of the band pass filter 5C is the same as or similar to the configuration of FIG. 22, except that the adjustment electrode portion 540A is replaced with an adjustment electrode portion 540C. A configuration of the adjustment electrode portion 540C is the same as or similar to the configuration of the adjustment electrode portion 540A, except that the adjustment electrodes 542 and 543 are excluded. Repeated description of the same or similar points is omitted.

Figure 26:
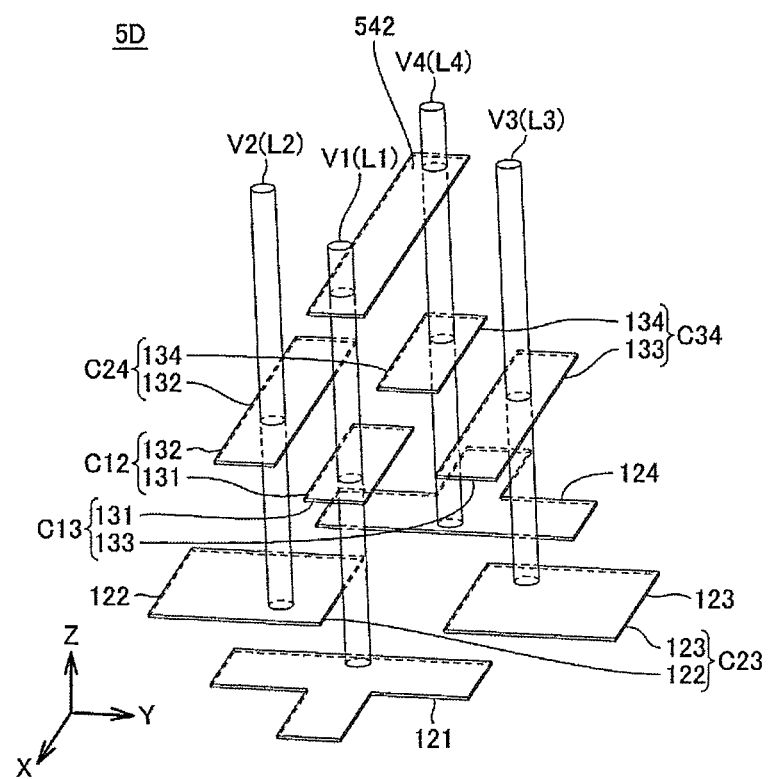
FIG. 26 illustrates an electrode structure of a band pass filter according to Modification 4 of Preferred Embodiment 5 of the present invention.

FIG. 26 illustrates an electrode structure of a band pass filter 5D according to Modification 4 of Preferred Embodiment 5. A configuration of the band pass filter 5D is the same as or similar to the configuration of FIG. 22, except that the adjustment electrode portion 540A is replaced with an adjustment electrode 542 (adjustment electrode portion). Repeated description of the same or similar points is omitted.

Figure 27:
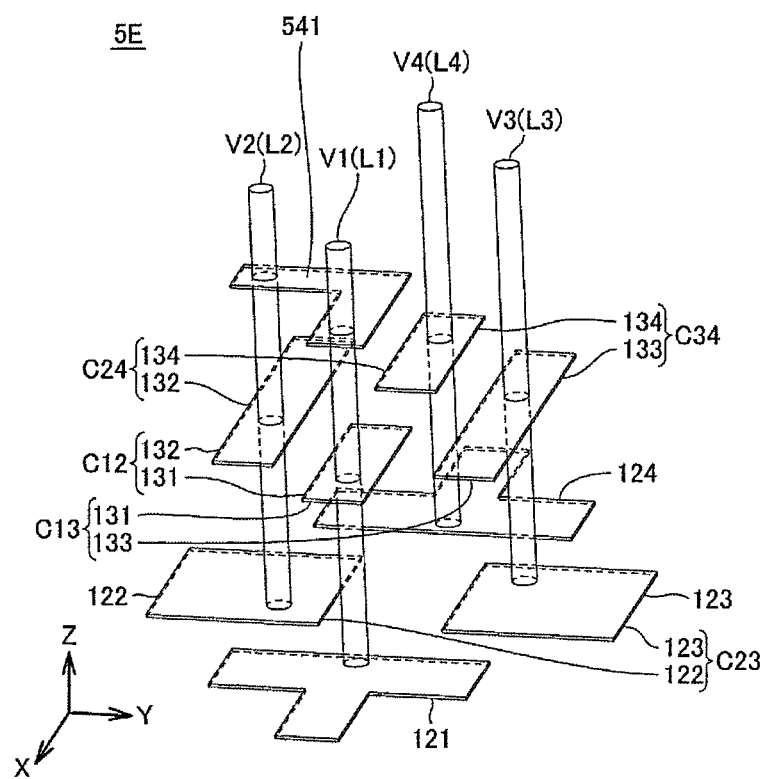
FIG. 27 illustrates an electrode structure of a band pass filter according to Modification 5 of Preferred Embodiment 5 of the present invention.

FIG. 27 illustrates an electrode structure of a band pass filter 5E according to Modification 5 of Preferred Embodiment 5. A configuration of the band pass filter 5E is the same as or similar to the configuration of FIG. 22, except that the adjustment electrode portion 540A is replaced with an adjustment electrode 541 (adjustment electrode portion). Repeated description of the same or similar points is omitted.

As described above, according to the LC filters according to Preferred Embodiment 5 and Modifications 1 to 5, accuracy of adjustment of characteristics of the LC filters can be improved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An LC filter comprising:
 a plurality of dielectric layers laminated in a laminating direction;
 a first LC resonator;
 a second LC resonator;
 a third LC resonator; and
 a fourth LC resonator; wherein
 the first LC resonator includes a first via conductor extending in the laminating direction and at least one first electrode connected to the first via conductor between two ends of the first via conductor;
 the second LC resonator includes a second via conductor extending in the laminating direction and at least one second electrode connected to the second via conductor between two ends of the second via conductor;
 the third LC resonator includes a third via conductor extending in the laminating direction and at least one third electrode connected to the third via conductor between two ends of the third via conductor;
 the fourth LC resonator includes a fourth via conductor extending in the laminating direction;
 in plan view viewed from the laminating direction, the second via conductor and the fourth via conductor are disposed on two sides of a virtual line connecting the first via conductor and the third via conductor;
 each of the second via conductor and the fourth via conductor defines an inductor that is spaced apart from the virtual line when viewed in the plan view; and
 the at least one second electrode faces the at least one first electrode and the at least one third electrode.

2. The LC filter according to claim 1, wherein
 the fourth LC resonator further includes at least one fourth electrode connected to the fourth via conductor between two ends of the fourth via conductor; and
 the at least one fourth electrode faces the at least one first electrode and faces the at least one third electrode.

3. The LC filter according to claim 2, wherein the plurality of dielectric layers include a first dielectric layer in which the at least one first electrode, the at least one second electrode, the at least one third electrode, and the at least one fourth electrode are provided.

4. The LC filter according to claim 2, further comprising:
 a first ground electrode; wherein
 the first LC resonator further includes a first capacitor electrode connected to one end of the first via conductor and facing the first ground electrode in the laminating direction;
 the second LC resonator further includes a second capacitor electrode connected to one end of the second via conductor and facing the first ground electrode in the laminating direction;
 the third LC resonator further includes a third capacitor electrode connected to one end of the third via conductor and facing the first ground electrode in the laminating direction; and
 the fourth LC resonator further includes a fourth capacitor electrode connected to one end of the fourth via conductor and facing the first ground electrode in the laminating direction.

5. The LC filter according to claim 4, wherein the plurality of dielectric layers include a second dielectric layer in which the first capacitor electrode, the second capacitor electrode, the third capacitor electrode, and the fourth capacitor electrode are provided.

6. The LC filter according to claim 4, further comprising a second ground electrode to which another end of the first via conductor, another end of the second via conductor, another end of the third via conductor, and another end of the fourth via conductor are connected.

7. The LC filter according to claim 4, further comprising:
 a second ground electrode; wherein
 the first LC resonator further includes a fifth capacitor electrode connected to another end of the first via conductor and facing the second ground electrode in the laminating direction;
 the second LC resonator further includes a sixth capacitor electrode connected to another end of the second via conductor and facing the second ground electrode in the laminating direction;
 the third LC resonator further includes a seventh capacitor electrode connected to another end of the third via conductor and facing the second ground electrode in the laminating direction; and the fourth LC resonator further includes an eighth capacitor electrode connected to another end of the fourth via conductor and facing the second ground electrode in the laminating direction.

8. The LC filter according to claim 2, wherein the at least one first electrode includes a plurality of first electrodes, the at least one second electrode includes a plurality of second electrodes, the at least one third electrode includes a plurality of third electrodes, and the at least one fourth electrode includes a plurality of fourth electrodes.

9. The LC filter according to claim 1, wherein a ratio of a distance from the one end of the first via conductor to the at least one first electrode to a length of the first via conductor is equal to or more than about 0.05 and equal to or less than about 0.95.

10. The LC filter according to claim 1, further comprising an adjustment electrode portion connecting at least two via conductors among the first via conductor, the second via conductor, the third via conductor, and the fourth via conductor.

11. The LC filter according to claim 10, wherein the adjustment electrode portion includes an adjustment electrode connecting the first via conductor, the second via conductor, the third via conductor, and the fourth via conductor.

12. The LC filter according to claim 11, wherein the side surface electrode defines an input/output terminal.

13. The LC filter according to claim 10, wherein the adjustment electrode portion includes a first adjustment electrode connecting the first via conductor and the second via conductor, a second adjustment electrode connecting the first via conductor and the third via conductor, a third adjustment electrode connecting the second via conductor and the fourth via conductor, and a fourth adjustment electrode connecting the third via conductor and the fourth via conductor.

14. The LC filter according to claim 1, wherein
the LC filter has a rectangular or substantially rectangular parallelepiped shape; and
a side surface electrode is provided on a side surface of the LC filter.

15. The LC filter according to claim 1, wherein the first via conductor defines a first inductor.

16. The LC filter according to claim 1, wherein the inductor of the second via conductor defines a second inductor.

17. The LC filter according to claim 1, wherein the third via conductor defines a third inductor.

18. The LC filter according to claim 1, wherein the inductor of the fourth via conductor defines a fourth inductor.

* * * * *